United States Patent
Shin et al.

(10) Patent No.: US 10,559,362 B2
(45) Date of Patent: Feb. 11, 2020

(54) NON-VOLATILE MEMORY DEVICE AND A READ METHOD THEREOF

(71) Applicant: SAMSUNG ELECTRONICS CO., LTD., Suwon-si, Gyeonggi-do (KR)

(72) Inventors: Dong Jin Shin, Hwaseong-si (KR); Ji Su Kim, Seoul (KR); Dae Seok Byeon, Seongnam-si (KR); Ji Sang Lee, Iksan-si (KR); Jun Jin Kong, Yongin-si (KR); Eun Chu Oh, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/141,294

(22) Filed: Sep. 25, 2018

(65) Prior Publication Data

US 2019/0252027 A1    Aug. 15, 2019

(30) Foreign Application Priority Data

Feb. 9, 2018 (KR) .......................... 10-2018-0016347

(51) Int. Cl.
| | |
|---|---|
| *G11C 7/22* | (2006.01) |
| *G11C 16/26* | (2006.01) |
| *G11C 16/10* | (2006.01) |
| *G11C 5/14* | (2006.01) |
| *G11C 16/24* | (2006.01) |
| *G11C 16/08* | (2006.01) |

(52) U.S. Cl.
CPC .............. *G11C 16/26* (2013.01); *G11C 5/147* (2013.01); *G11C 16/08* (2013.01); *G11C 16/10* (2013.01); *G11C 16/24* (2013.01)

(58) Field of Classification Search
CPC .......... G11C 16/08; G11C 16/10; G11C 16/24
USPC .......................................................... 365/11
See application file for complete search history.

(56) References Cited

U.S. PATENT DOCUMENTS

| | | | |
|---|---|---|---|
| 7,542,350 B2 | 6/2009 | Park et al. | |
| 7,716,538 B2 | 5/2010 | Gonzalez et al. | |
| 8,547,752 B2 | 10/2013 | Eun et al. | |
| 9,009,390 B2 | 4/2015 | Choi et al. | |
| 9,064,575 B2 | 6/2015 | Parthasarathy et al. | |
| 9,117,536 B2 | 8/2015 | Yoon et al. | |
| 9,582,357 B2 | 2/2017 | Goldman et al. | |
| 9,754,683 B2 | 9/2017 | Goldman et al. | |
| 10,090,046 B2* | 10/2018 | Park | G11C 11/5642 |
| 2015/0049547 A1* | 2/2015 | Kim | G11C 29/028 365/185.09 |

(Continued)

*Primary Examiner* — Hoai V Ho
*Assistant Examiner* — Minh Dinh
(74) *Attorney, Agent, or Firm* — F. Chau & Associates, LLC

(57) ABSTRACT

A non-volatile memory device including: a page buffer configured to latch a plurality of page data constituting one bit page of a plurality of bit pages, and a control logic configured to compare results of a plurality of read operations performed in response to a high-priority read signal set to select one of a plurality of read signals included in the high-priority read signal set as a high-priority read signal, and determine a low-priority read signal corresponding to the high-priority read signal, wherein the high-priority read signal set is for reading high-priority page data, and the low-priority read signal is for reading low-priority page data.

29 Claims, 21 Drawing Sheets

(56) References Cited

U.S. PATENT DOCUMENTS

2017/0206007 A1\* 7/2017 Shin .................. G06F 3/061
2018/0158493 A1\* 6/2018 Ryu .................. G11C 7/1006

\* cited by examiner

NON-VOLATILE MEMORY DEVICE AND A READ METHOD THEREOF

CROSS-REFERENCE TO RELATED APPLICATION(S)

This application claims priority under 35 U.S.C. § 119 to Korean Patent Application No. 10-2018-0016347 filed on Feb. 9, 2018 in the Korean Intellectual Property Office, the disclosure of which is incorporated by reference herein in its entirety.

1. TECHNICAL FIELD

The present inventive concept relates to a non-volatile memory device, and a read method thereof.

2. DESCRIPTION OF RELATED ART

A semiconductor memory device may be classified as a volatile semiconductor memory device or a non-volatile semiconductor memory device. A volatile semiconductor memory device may have stored contents disappear, when a power supply is cut off. On the other hand, the non-volatile semiconductor memory device may preserve its contents, when a power supply is cut off. Therefore, the non-volatile semiconductor memory device may be used to store contents to be preserved, in the absence of power.

A flash memory device may be an example of the non-volatile memory device. The flash memory device may be widely used as a voice and image data storage medium in a variety of information devices, such as computers, mobile phones, smartphones, digital cameras, camcorders, voice recorders, MP3 players, personal digital assistants (PDAs), handheld computers, game machines, fax machines, scanners, printers, or the like. Currently, high capacity, high-speed input/output, and low power consumption non-volatile memory devices are being researched for use in mobile devices such as smartphones.

SUMMARY

According to an exemplary embodiment of the present inventive concept, a non-volatile memory device includes: a page buffer configured to latch a plurality of page data constituting one bit page of a plurality of bit pages, and a control logic configured to compare results of a plurality of read operations performed in response to a high-priority read signal set to select one of a plurality of read signals included in the high-priority read signal set as a high-priority read signal, and determine a low-priority read signal corresponding to the high-priority read signal, wherein the high-priority read signal set is for reading high-priority page data, and the low-priority read signal is for reading low-priority page data.

According to an exemplary embodiment of the present inventive concept, a non-volatile memory device includes: a page buffer including a latch set for latching a plurality of page data constituting one bit page of a plurality of bit pages; and a control logic for comparing results of a plurality of read operations performed in response to a plurality of high-priority read signal sets to select a high-priority read signal in each of the high-priority read signal sets, and for determining a level of a low-priority read signal, depending on a level of the high-priority read signal selected in each of the high-priority read signal sets, during a read operation of low-priority page data following a read operation of high-priority page data, wherein the plurality of high-priority read signal sets are for reading the high-priority page data.

According to an exemplary embodiment of the present inventive concept, a read method of a non-volatile memory device includes: comparing results of a plurality of read operations performed according to a high-priority read signal set, selecting a high-priority read signal corresponding to high-priority page data from the high-priority read signal set; and determining low-priority read signals for reading low-priority page data, depending on the level of the high-priority read signal, wherein levels of the low-priority read signals are determined by comparing a spread direction of distribution of the high-priority page data and a spread direction of distribution of the low-priority page data.

According to an exemplary embodiment of the present inventive concept, a non-volatile memory device includes: a page buffer configured to latch a plurality of page data constituting one bit page of a plurality of bit pages, and a control logic configured to perform an On-Chip Valley Search (OCVS) reading operation to identify high-priority page data, and a normal reading operation to identify low-priority page data, wherein a low-priority read signal is selected for the normal reading operation by using a high-priority read signal from the high-priority page data.

BRIEF DESCRIPTION OF THE DRAWINGS

The above and other features of the present inventive concept will be more clearly understood by describing in detail exemplary embodiments thereof with reference to the accompanying drawings, in which.

DETAILED DESCRIPTION OF THE EMBODIMENTS

Figure 1:
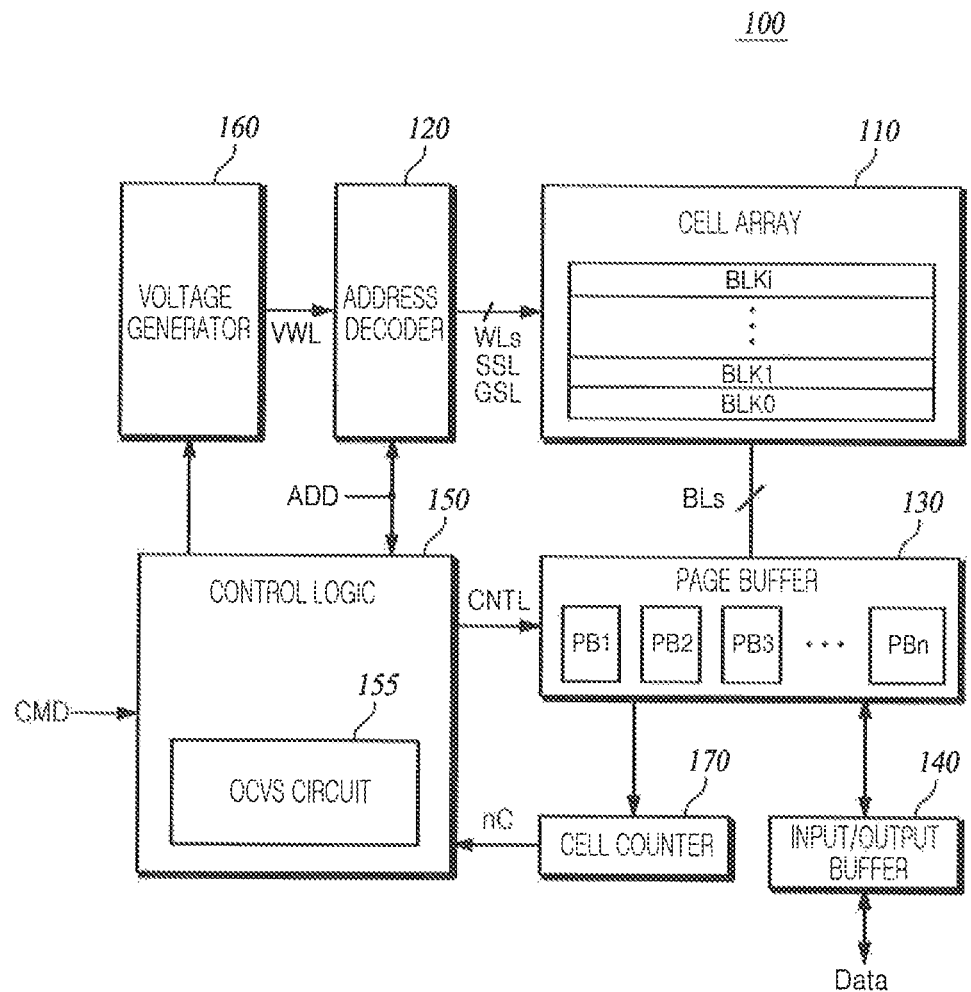
FIG. 1 is a block diagram of a non-volatile memory device according to an exemplary embodiment of the present inventive concept.

Hereinafter, exemplary embodiments of the present inventive concept will be described with reference to the accompanying drawings. Like numerals may refer to like elements in the drawings.

In the following, a NAND type flash memory device may be used as an example of a non-volatile memory device for explaining features and functions of the present inventive concept. It is to be understood, however, that exemplary embodiments of the present inventive concept may be applied to phase-change random access memory (PRAM), magnetoresistive RAM (MRAM), resistive RAM (Re-RAM), ferroelectric RAM (FRAM), NOR flash memory, or the like.

FIG. 1 is a block diagram of a non-volatile memory device according to an exemplary embodiment of the present inventive concept. Referring to FIG. 1, a non-volatile memory device 100 may include a cell array 110, an address decoder 120, a page buffer 130, an input/output buffer 140, a control logic 150, a voltage generator 160, and a cell counter 170.

The cell array 110 may be connected to the address decoder 120 via word lines WLs or selection lines SSL and GSL. The selection lines may include string selection lines SSL and ground selection lines GSL. The cell array 110 may be connected to the page buffer 130 via bit lines BLs. The cell array 110 may include a plurality of memory blocks BLK0 to BLKi, and each of the memory blocks BLK0 to BLKi may include a plurality of NAND cell strings. Each channel of cell strings may be formed in a vertical or horizontal direction. The cell array 110 may include a plurality of memory cells forming cell strings. The plurality of memory cells may be programmed, erased, and read by a voltage supplied via the bit line BLs or the word line WLs. A program operation may be performed on a page basis, and an erase operation may be performed on a memory block (BLK0 to BLKi) basis. Each of the memory blocks BLK0 to BLKi may include a three-dimensional memory array.

The address decoder 120 may select any one of the memory blocks BLK0 to BLKi of the cell array 110 in response to an address ADD. The address decoder 120 may select any one of the word lines WLs of the selected memory block in response to the address ADD. The address decoder 120 may transfer a voltage of a word line VWL corresponding to the operation mode to the word line of the selected memory block. The voltage of the word line VWL may also be referred to as a wordline voltage. In a program operation, the address decoder 120 may transfer a program voltage Vpgm and a verification voltage Vfy to a selected word line (e.g., Selected WL), and a pass voltage Vpass to an unselected word line (e.g., Unselected WL). In a read operation, the address decoder 120 may transfer a selected read voltage Vrd to a selected word line (e.g., Selected WL), and an unselected read voltage Vread to an unselected word line (e.g., Unselected WL).

The page buffer 130 may be operated as a writing driver or a sense amplifier. In a program operation, the page buffer 130 may transfer a bit line voltage corresponding to data to be programmed to bit lines BLs of the cell array 110. In a read operation, the page buffer 130 may sense data stored in the selected memory cell through one of the bit lines BLs, for example. Each of a plurality of page buffers PB1 to PBn included in the page buffer 130 may be connected to one or two bit lines BLs.

Each of the plurality of page buffers PB1 to PBn may perform a latching operation for sensing and storing data of selected memory cells to perform an On-Chip Valley Search (OCVS) read operation. Each of the plurality of page buffers PB1 to PBn may perform a plurality of sensing operations to identify a state of any one of the selected memory cells under control of the control logic 150.

For example, assuming that a physical page is composed of a plurality of bit pages, one piece of page data of a plurality of page data constituting one bit page may be read out from an identification of one state of the memory cells. Each of the plurality of page buffers PB1 to PBn may store sensed data through a plurality of sensing operations, and may select any one of a plurality of stored data. Each of the plurality of page buffers PB1 to PBn may perform sensing a plurality of times to identify a state of any one of the memory cells, for example, to identify one piece of page data of the plurality of page data. Each of the plurality of page buffers PB1 to PBn may select or output optimal data from a plurality of sensed data under control of the control logic 150.

The input/output buffer 140 may transfer externally provided data Data to the page buffer 130. The input/output buffer 140 may transfer an externally provided command CMD to the control logic 150, and transfer an externally provided address ADD to the control logic 150 or the address decoder 120. In addition, the input/output buffer 140 may output data latched by the page buffer 130 to the outside. For example, the input/output buffer 140 may output data to a device other than the non-volatile memory device 100.

The control logic 150 may control the page buffer 130 and the address decoder 120 in response to the command CMD externally provided through the input/output buffer 140. The control logic 150 may control the page buffer 130 and the address decoder 120 to perform program, reading, and erase operations on memory cells selected according to the command CMD.

In particular, the control logic 150 may control the page buffer 130 and the voltage generator 160 in an OCVS read operation according to an exemplary embodiment of the present inventive concept. The control logic 150 may control the page buffer 130 to perform a plurality of sensing operations to identify a specific state of selected memory cells. The control logic 150 may control the plurality of page buffers PB1 to PBn, to store data corresponding to each of a plurality of sensing operations, in a plurality of latches provided in each of the plurality of page buffers PB1 to PBn. The control logic 150 may perform a process for selecting optimal data from data sensed a plurality of times. For optimal data selection, the control logic 150 may refer to a count result nC provided from the cell counter 170. For example, the control logic 150 may control the page buffer 130 to select and output a reading result closest to a distribution valley among a plurality of sensed data. The control logic 150 may include an OCVS circuit 155 to perform this operation.

The voltage generator 160 may generate various types of word line voltages VWLs to be supplied to each of the word lines WLs under control of the control logic 150. The voltage generator 160 may also generate a voltage to be supplied to a bulk, for example, a well region. The word line voltages VWLs to be supplied to each of the word lines WLs may include a program voltage Vpgm, a pass voltage Vpass, selected and unselected read voltages Vrd and Vread, or the like.

The cell counter 170 may count memory cells corresponding to a specific threshold voltage range from data sensed in the page buffer 130. For example, the cell counter 170 may process data sensed and stored in each of the plurality of page buffers PB1 to PBn to count the number of memory cells having a threshold voltage of a certain threshold voltage range.

The non-volatile memory device 100 according to an exemplary embodiment of the present inventive concept may perform a plurality of sensing operations on selected memory cells. The non-volatile memory device 100 may select optimal data from a plurality of sensing data, and output the selected data to the outside. According to an exemplary embodiment of the present inventive concept, a non-volatile memory device may select data sensed by an optimal read voltage, such that data having high reliability may be provided.

Figure 2:
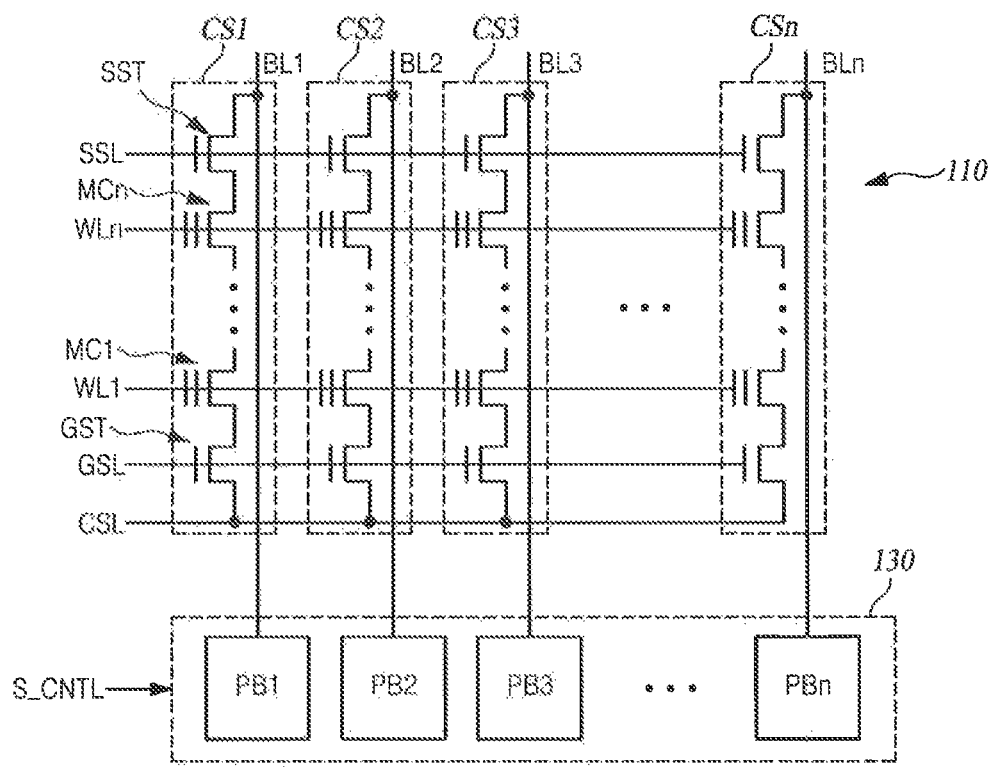
FIG. 2 is a block diagram illustrating a cell array and a page buffer of FIG. 1, according to an exemplary embodiment of the present inventive concept.

FIG. 2 is a block diagram illustrating the cell array 110 and the page buffer 130 of FIG. 1, according to an exemplary embodiment of the present inventive concept. Referring to FIG. 2, page buffers PB1 to PBn may be respectively connected to bit lines BL1 to BLn. The bit lines BL1 to BLn may be connected to cell strings CS1 to CSn.

The cell strings CS1 to CSn included in the cell array 110 may be connected to the bit lines BL1 to BLn through string selection transistors SST, respectively. Gates of each of the string selection transistors SST may be connected to a string selection line SSL. The cell strings CS1 to CSn may be connected to a common source line CSL via a ground selection transistor GST, respectively. The gates of each of the ground selection transistors GST may be connected to ground selection lines GSL. Each of the cell strings CS1 to CSn may include a plurality of memory cells MC1 to MCn connected to a plurality of word lines WL1 to WLn, for example.

The page buffer PB1 may be connected to the cell string CS1 through the bit line BL1. The page buffer PB1 may set up or precharge the bit line BL1 during a program operation. In a read operation, the page buffer PB1 may precharge the bit line BL1, and may sense whether a selected memory cell is on or off. The page buffer PB1 may include transistors for supplying a power supply voltage to the bit lines BL1 to BLn. The page buffer PB1 may be provided with a control signal S_CNTL from the control logic 150 for controlling transistors. The control signal S_CNTL may include a plurality of control signals BLSHF and BLSLT. The bit lines BL1 to BLn may be precharged and developed by the control signals BLSHF and BLSLT.

Figure 3:
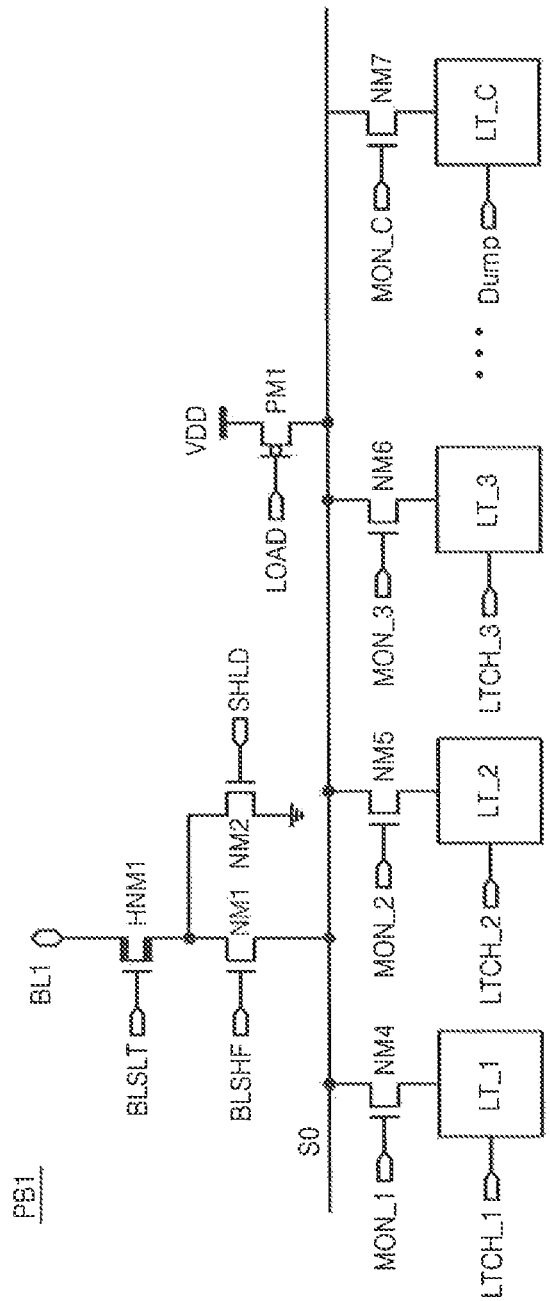
FIG. 3 is a block diagram of a page buffer of FIGS. 1 and 2, according to an exemplary embodiment of the present inventive concept.

FIG. 3 is a block diagram of a page buffer of FIGS. 1 and 2, according to an exemplary embodiment of the present inventive concept. Referring to FIG. 3, a page buffer PB1 connected to a bit line BL1 may be connected to memory cells of a cell string CS1 (see FIG. 2). The page buffer PB1 may include a sensing node SO connected to the bit line BL1. The page buffer PB1 may include a plurality of latches LT_1, LT_2, LT_3, . . . , LT_C, respectively, connected to the sensing node SO. A plurality of transistors NM4, NM5, NM6, . . . , NM7 are disposed between the latches LT_1, LT_2, LT_3, . . . , LT_C and respectively receive signals MON_1, MON_2, MON_3, . . . , MON_C, for example.

In a read operation, the bit line BL may be precharged by the control logic 150. For example, when a load signal LOAD and a control signal BLSHF are activated, the bit line BL1 may be precharged to a specific level VBL. At this time, a high-voltage transistor HNM1 may be kept turned on by a bit line selection signal BLSLT. A transistor NM2 may be connected between a terminal of the high-voltage transistor HNM1 and ground and receive signal SHLD, for example.

Subsequently, when the load signal LOAD is inactivated, charges charged in the sensing node SO may flow to the bit line BL1 through a transistor NM1 turned on by the control signal BLSHF. For example, a development operation in which a change in electric potential of the sensing node SO occurs may be performed. When a selected memory cell is an on cell, charges charged in the sensing node SO may be discharged to a common source line CSL through the bit line BL1 and the channel of the string CS1. In this case, since an electric current flowing from the sensing node SO to the bit line BL1 is relatively high, a speed of a voltage drop of the sensing node SO may be relatively fast. On the other hand, when a selected memory cell is an off cell, charges charged in the sensing node SO may not be discharged to the common source line CSL through the bit line BL1. Therefore, since an electric current flowing from the sensing node SO to the bit line BL1 is relatively low, the speed of the voltage drop of the sensing node SO may be relatively slow.

The plurality of latches LT_1, LT_2, LT_3, . . . , LT_C may be provided with latch control signals LTCH_1, LTCH_2, LTCH_3, . . . , Dump for sensing and storing the developed state of the sensing node SO. The plurality of latches LT_1, LT_2, LT_3, . . . , LT_C may sense the selected memory cells a plurality of times according to the latch control signals LTCH_1, LTCH_2, LTCH_3, . . . , Dump, and may store a plurality of sensed data. In one example, the latch control signals LTCH_1, LTCH_2, LTCH_3, . . . , Dump may be sequentially provided.

According to an exemplary embodiment of the present inventive concept, the plurality of latches LT_1, LT_2, LT_3, . . . , LT_C may perform a latching operation for sensing a plurality of times and storing a plurality of sensed data, to read one state of selected memory cells in an OCVS read operation, for example, to identify one piece of page data among a plurality of page data. In the OCVS read operation, according to a plurality of read signals, e.g., a read signal set, a read voltage having a plurality of different levels may be provided to word lines of selected memory cells, or a plurality of latching signals may be provided to a plurality of latches at different times from each other. On/off states of the memory cells selected according to the plurality of read signals may be sequentially stored in the plurality of latches LT_1, LT_2, L_3, . . . , LT_C. In this case, the read signals may be a control signal for determining a level of read voltage or a latching time of the latching operation. For example, the read signal may determine a level of the read voltage or a latching time of the latching operation. As will be described later, a change in the latching time may have effects corresponding to changing the level of the read voltage. Hereinafter, for convenience, the level of the read signal and the level of the read voltage may be interchangeably described.

The cell counter 170 may use data stored in the plurality of latches LT_1, LT_2, LT_3, . . . , LT_C to count the number of memory cells whose threshold voltage is present between read voltages having different levels from each other. For example, data sensed by a first read voltage may be stored in each of first latches LT_1 of the page buffers PB1 to PBn, while data sensed by a second read voltage may be stored in each of second latches LT_2 of the page buffers PB1 to PBn. In this case, the first latches LT_1 of each of the page buffers PB1 to PBn may be referred to as a first latch set, and the second latches LT_2 of each of the page buffers PB1 to PBn may be referred to as a second latch set. When an exclusive OR (XOR) operation is performed between bits stored in the first latches LT_1 of the page buffers PB1 to PBn and bits stored in the second latches LT_2 of the page buffers PB1 to PBn, the number of memory cells having a threshold voltage between the first read voltage and the second read voltage may be calculated. Further, according to an exemplary embodiment of the present inventive concept, the calculation and comparison of the number of memory cells having a threshold voltage between the first read voltage and the second read voltage may be performed using a current comparator in the form of a differential amplifier according to a value of bits stored in respective latches.

Any one of the latches, for example, the latch LT_1, may be controlled such that only states of the sensing nodes SO are sequentially latched, and each of the plurality of latches LT_2, LT_3, . . . , LT_C may be controlled such that the sensed data is copied from the latch LT_1. In addition, any one of the latches, for example, the latch LT_C, may be used for outputting data of a selected one of the latches.

Figure 4:
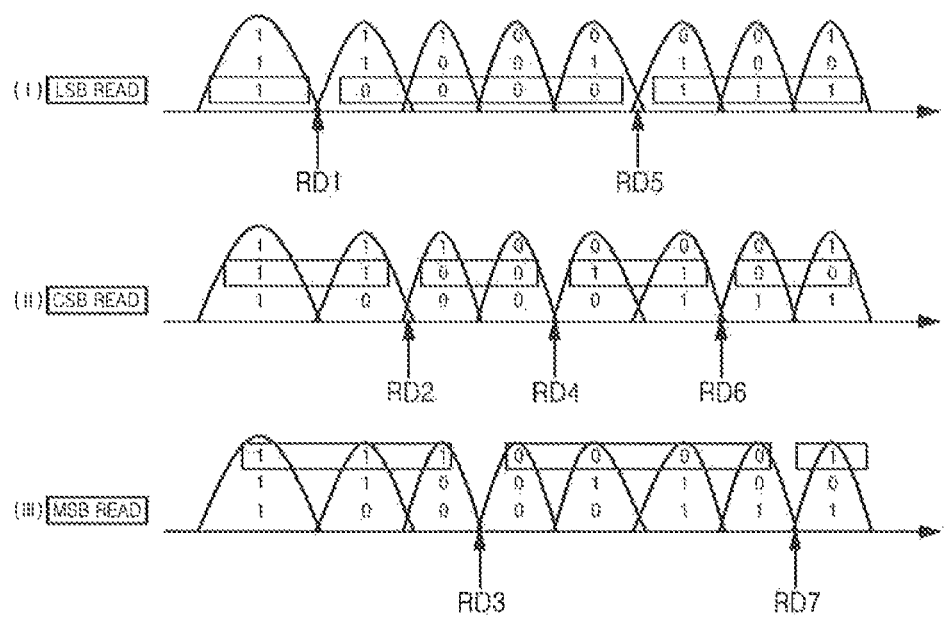
FIG. 4 is a diagram illustrating a normal read method of a memory cell, according to an exemplary embodiment of the present inventive concept.

FIG. 4 is a diagram illustrating a normal read method of a memory cell, according to an exemplary embodiment of the present inventive concept. Referring to FIG. 4, a page-by-page read method of a triple level cell TLC capable of storing 3 bits of data per cell may be illustrated as an example. Then, an operation of the present inventive concept will be described on the assumption that the memory cell is a triple level cell TLC. However, a method to be described later may involve a quadruple level cell QLC capable of storing 4 bits of data per cell, and may be applied to a multiple level cell capable of storing 4 bits of data or more.

The triple level cell TLC may include a physical page including a plurality of logic pages. For example, the plurality of logic pages may include a least significant bit (LSB) page, a center bit (CSB) page, and a most significant bit (MSB) page.

To read the least significant bit (LSB) page, a read voltage RD1 may be provided to word lines of selected memory cells. A memory cell having a threshold voltage lower than the read voltage RD1 may be stored as a logic '1,' and a memory cell having a threshold voltage higher than the read voltage RD1 may be stored as a logic '0.' Then, a read voltage RD5 may be provided to the word lines of the selected memory cells. A memory cell having a threshold voltage lower than the read voltage RD5 may be maintained at a previously stored logic '0.' A memory cell having a threshold voltage higher than the read voltage RD5 may be toggled from a previously stored logic '0' to a logic '1.' And, after this process is completed, a reading result of the least significant bit (LSB) page may be output.

To read the center bit (CSB) page, a read voltage RD2 may be first provided to word lines of selected memory cells. A memory cell having a threshold voltage lower than the read voltage RD2 may be stored as a logic '1,' and a memory cell having a threshold voltage higher than the read voltage RD2 may be stored as a logic '0.' Then, a read voltage RD4 may be provided to the word lines of the selected memory cells. A memory cell having a threshold voltage lower than the read voltage RD4 may be maintained at a previously stored logic '0,' and a memory cell having a threshold voltage higher than the read voltage RD4 may be toggled from a previously stored logic '0' to a logic '1.' Finally, a read voltage RD6 may be provided to the word lines of the selected memory cells. A memory cell having a threshold voltage lower than the read voltage RD6 may be maintained at a previously sensed logic value, and a memory cell having a threshold voltage higher than the read voltage RD6 may be toggled to a logic '0.' After this process is completed, the reading result of the center bit (CSB) page may be output.

To read the most significant bit (MSB) page, a read voltage (RD3) may be provided to word lines of selected memory cells. A memory cell having a threshold voltage lower than the read voltage RD3 may be stored as a logic '1,' and a sensing result of a memory cell having a threshold voltage higher than the read voltage RD3 may be stored as a logic '0.' Then, a read voltage RD7 may be provided to the word lines of the selected memory cells. A memory cell having the threshold voltage lower than the read voltage RD7 may be maintained at a previously stored logic '0,' and a memory cell having the threshold voltage higher than the read voltage RD7 may be toggled from a previously stored logic '0' to logic '1.' After this process is completed, a reading result of the most significant bit (MSB) page may be output.

In this normal read operation, a "read fail" may occur due to deterioration of the memory cell. The non-volatile memory device 100 according to an exemplary embodiment of the present inventive concept may perform an OCVS read operation to provide high reliability according to an external request or an internal judgment, and may provide the result thereof to the outside.

Although, in the above description, two or three read voltages are provided to read page data of one bit page of the triple level cell TLC, four or more read voltages may be provided, according to an exemplary embodiment of the present inventive concept.

Figure 5:
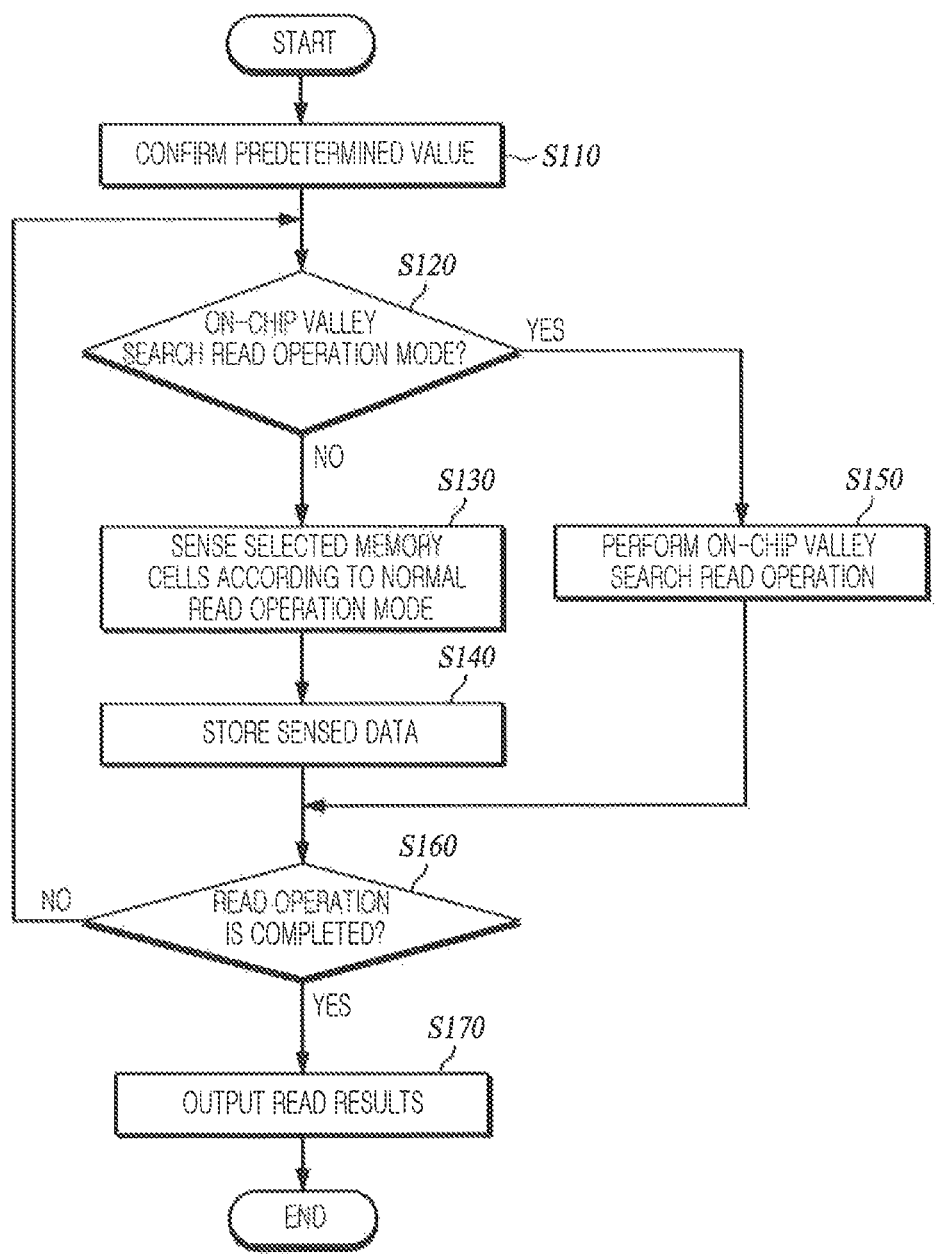
FIG. 5 is a flowchart of a read method of a non-volatile memory device according to an exemplary embodiment of the present inventive concept.

FIG. 5 is a flowchart of a read method of a non-volatile memory device according to an exemplary embodiment of the present inventive concept. Referring to FIG. 5, the non-volatile memory device 100 may perform a normal read operation mode or an OCVS read operation mode according to a predetermined read operation mode.

In operation S110, the non-volatile memory device 100 may confirm a set value related to a requested read operation. In other words, the non-volatile memory device 100 may confirm a predetermined value. In one example, the control logic 150 may check whether a page requested to be read is a most significant bit (MSB) page, a center bit (CSB) page, or a least significant bit (LSB) page. In addition, the control logic 150 may check an order of applying a read signal to read a selected page. In addition, the control logic 150 may check whether a current read operation mode is a normal read operation mode or an OCVS read operation mode. In the normal read operation mode, a read signal may be provided once to identify one state for a memory cell, for example, to identify one piece of page data of a plurality of page data. On the other hand, in the OCVS read operation mode, read signals having different levels from each other may be provided a plurality of times, and a comparison operation for sensing data may be performed to identify one state.

In operation S120, it may be determined whether a read operation mode is an OCVS read operation mode. When a read operation mode is not the OCVS read operation mode, in operation S130, the control logic 150 may control the voltage generator 160 and the page buffer 130 to perform a normal read operation in which a read signal is provided once. Accordingly, a read voltage corresponding to a read signal may be provided to word lines of selected memory cells, and whether the selected memory cells are turned on/off in the page buffer 130 may be sensed. Then, in operation S140, the sensed data may be stored in a latch of the page buffer 130. When the predetermined read operation mode is the OCVS read operation mode, in operation S150, the control logic 150 may control the voltage generator 160 and the page buffer 130 to perform the OCVS read operation, which provides the read signal a plurality of times. In the OCVS read operation mode, according to a plurality of read signals, for example, a read signal set, a read voltage having a plurality of different levels may be provided to word lines of selected memory cells, or a plurality of latching signals may be provided at different times from each other. In operation S160, the control logic 150 may determine whether the read operation has been completed. When the read operation for the memory cells of the selected page is determined to be completed, in operation S170, a reading result calculated by the normal operation mode or the OCVS read operation mode may be output to the outside. When an additional read operation on the selected memory cells is required, the process may be returned to operation S120.

Figure 6:
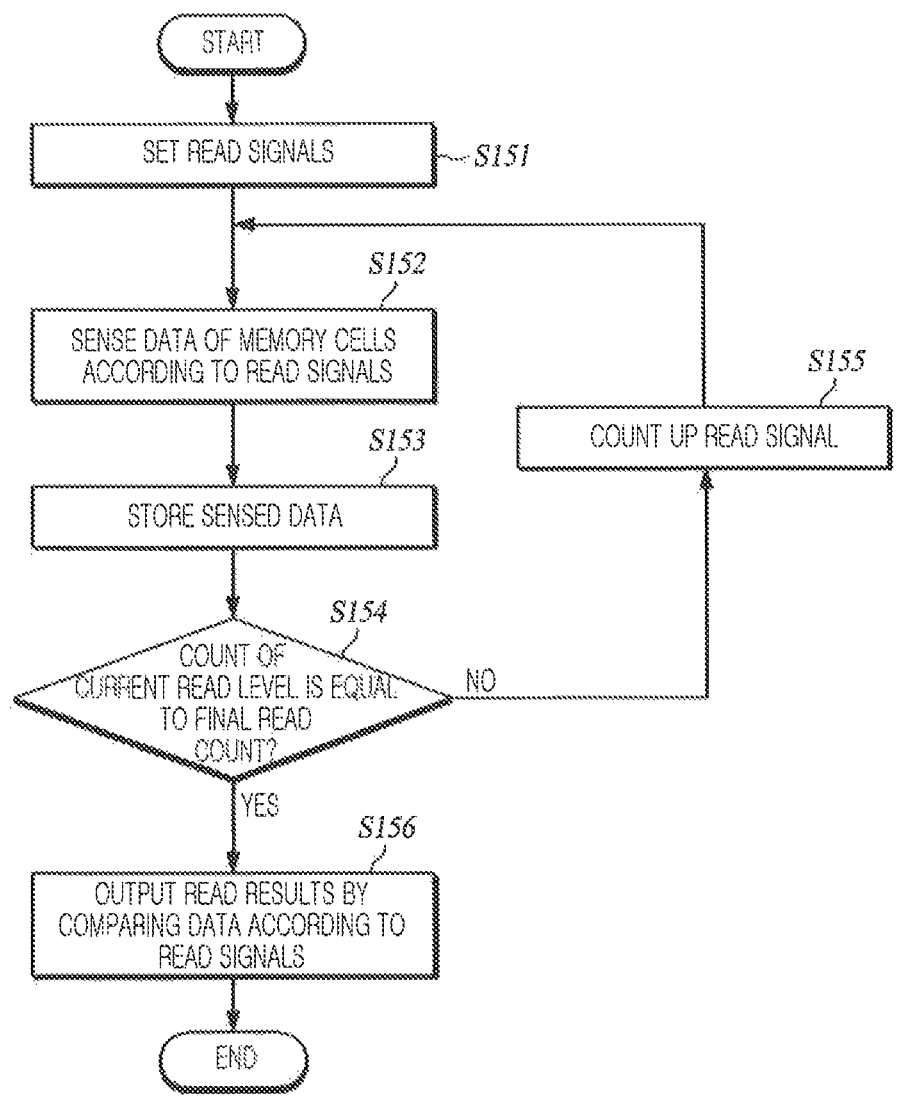
FIG. 6 is a flowchart of an On-Chip Valley Search (OCVS) read operation according to an exemplary embodiment of the present inventive concept.

FIG. 6 is a flowchart of an OCVS read operation according to an exemplary embodiment of the present inventive concept. Referring to FIG. 6, the OCVS read operation shown in operation 8150 of FIG. 5 is illustrated.

In operation S151, read signals may be set. The read signals may include information about a reading count, and may include information about a level of the read signals that determines an interval between the read signals. The reading count may represent a specific state of the selected memory cells, for example, the number of searches for one piece of page data among a plurality of page data. In one example, the reading count may represent the number of times the read signal is provided to identify an erase state E0 and a program state P1 of a least significant bit (LSB) page, when the selected memory cells are triple level cells TLC. In another example, the reading count may represent the number of times the read voltage of different levels from each other are to be applied in the threshold voltage interval between the erase state E0 and the program state P1. Alternatively, the reading count may also refer to the number of data latches performed at different development points of the sensing node, although the same read voltage is provided to the selected memory cells. In this case, the reading count may be set at least two times. In addition, an interval between read signals may refer to a voltage interval between read voltages at different levels from each other, or a time interval between data latching operations performed at different development times.

In operation S152, according to the read signals, the data of the selected memory cells may be sensed. For example, the data of the selected memory cells may be sensed according to the number of times the read voltages are supplied, and the voltage interval between the read voltages. Alternatively, the data of the selected memory cells may be sensed according to the number of data latches performed at different development times and the time interval between data latching operations.

In operation S153, the sensed data may be stored in a latch. In this case, data obtained by different read signals may be sensed, and stored through different latches from each other.

In operation S154, it may be determined whether a current reading count is a predetermined final reading count. In other words, it may be determined whether the count of the current read level is equal to a final read count. A final reading count may correspond to a value set in operation S151. When a reading count of the currently performed read operation is not the final reading count, the process may proceed to operation S155. On the other hand, when a reading count of the currently performed read operation corresponds to the final reading count, the process may proceed to operation S156.

In operation S155, the reading count may be counted up, and operations S152 and S153 may be performed to sense and store data obtained by the counted up read signal. In operation S156, data obtained by the different read signals may be compared to output any one of reading results, and selected reading result.

Figure 7:
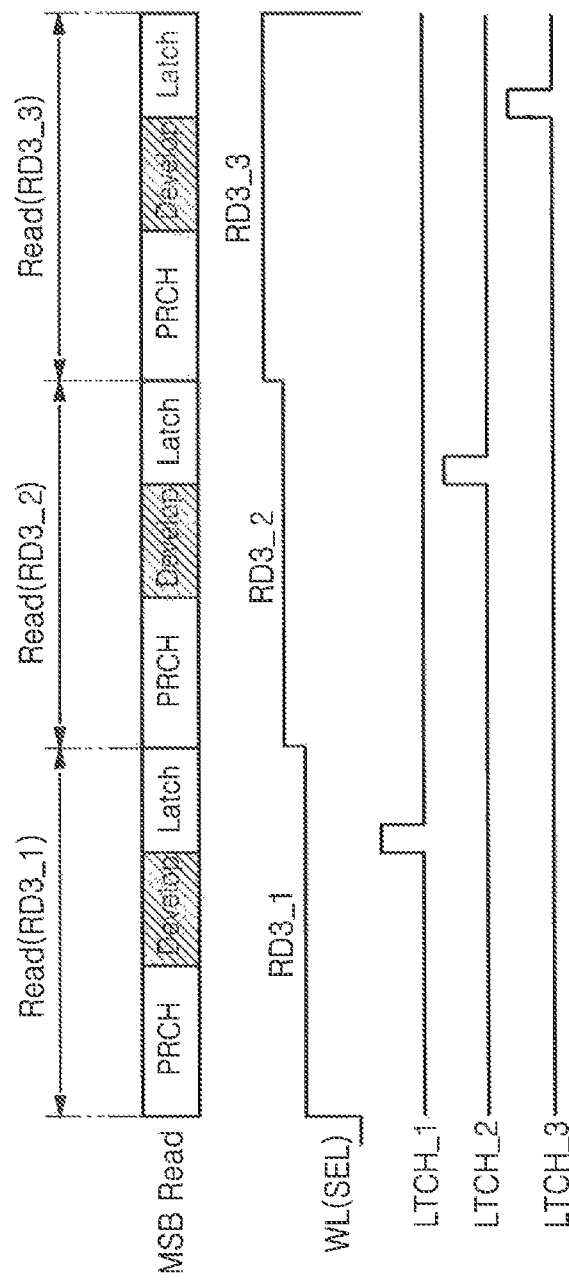
FIG. 7 is a timing diagram illustrating an OCVS read operation by read voltages having different levels according to an exemplary embodiment of the present inventive concept.

FIG. 7 is a timing diagram illustrating an OCVS read operation by read voltages having different levels according to an exemplary embodiment of the present inventive concept. Referring to FIG. 7, a read voltage provided to a word line may be varied for an OCVS read operation. To illustrate this, a case in which an OCVS read operation is applied to a most significant bit (MSB) page of a triple level cell TLC will be described as an example.

For the OCVS read operation of the most significant bit (MSB) page, a read voltage RD3_1 may first be applied to word lines of selected memory cells (e.g., WL (SEL)). A first latching signal LTCH_1 may be activated by each of the page buffers PB1 to PBn, at the time in which a precharge PRCH for a bit line BL and a sensing SO node, or a development thereof are completed. At this time, data corresponding to the read voltage RD3_1 may be stored in a first latch set.

Then, a read voltage RD3_2 may be applied to the word lines of the selected memory cells (e.g., WL (SEL)). The read voltage RD3__2 may be higher than the read voltage RD3_1, but correspond to a voltage for identifying the same one state as the read voltage RD3_1. A second latching signal LTCH_2 may be activated by each of the page buffers PB1 to PBn, at the time in which a precharge PRCH for a bit line BL and a sensing node SO, and a development thereof are completed. At this time, data corresponding to the read voltage RD3_2 may be stored in a second latch set of the page buffers PB1 to PBn.

A read voltage RD3_3 may be applied to the word lines of the selected memory cells (e.g., WL (SEL)). The read voltage RD3_3 may be higher than the read voltage RD3_2, but correspond to a voltage for identifying one state that is the same as the read voltage RD3_1 and the read voltage RD3_2. A third latching signal LTCH_3 may be activated by each of the page buffers PB1 to PBn, at the time in which a precharge PRCH for a bit line BL and a sensing node SO, and a development thereof are completed. At this time, data corresponding to the read voltage RD3_3 may be stored in the third latch set. When comparing the results stored in the first to third latch sets thereafter, any one of the latch sets may be selected.

Figure 8A:
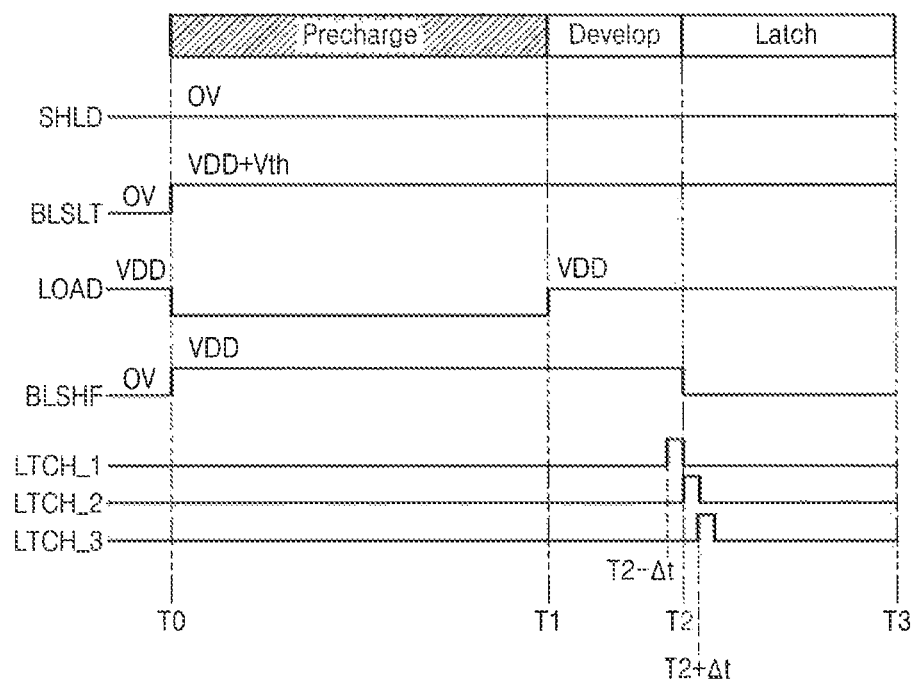
FIG. 8A is a timing diagram illustrating an OCVS read operation by a latching signal provided at different times according to an exemplary embodiment of the present inventive concept.

FIG. 8A is a timing diagram illustrating an OCVS read operation by a latching signal provided at different times according to an exemplary embodiment of the present inventive concept. Referring to FIGS. 3 and 8A, an OCVS read operation performed by sensing a sensing node at different development times and storing a plurality of sensing data will be described in detail.

A precharging operation may be performed from time T0 to time T1. Bit lines BL1 to BLn and sensing nodes SOs connected to the plurality of page buffers PB1 to PBn may be charged for precharging. For example, when the control signals BLSHF and BLSLT, and the load signal LOAD are activated, the sensing node SO and the bit line BL may be precharged to a specific level, respectively. In the precharging operation between time T0 and time T1, the signal SHLD of 0V may be applied to the transistor NM2 of FIG. 3, the control signal BLSLT may have a voltage level of VDD+Vth, the control signal BLSHF may have a voltage level of VDD, and the load signal LOAD may decrease from the voltage level of VDD, for example.

At time T1, when the load signal LOAD is deactivated to a high level, a p-channel metal oxide semiconductor (PMOS) transistor PM1 may be cut off, and a supply of electric current from a power supply voltage VDD to the sensing node SO may be cut off. As a result, a level of the sensing node SO may be changed, depending on a magnitude of a current flowing to a bit line BL, or depending on whether a memory cell is on or off. When a selected memory cell is an on cell, an electric current flowing to a bit line BL may be relatively large. Therefore, the level of the sensing node SO may be relatively quickly lowered. On the other hand, when a selected memory cell is an off cell, the level of the sensing node SO may be maintained at a substantially constant level.

Memory cells located around a distribution valley are memory cells located at boundaries between an on cell and an off cell. Therefore, an identification of an on cell or an off cell of these memory cells may vary, depending on a development time. For example, when the development time is slightly reduced, the memory cells located around the distribution valley may be identified as off cells. On the other hand, when the development time is slightly increased, the memory cells located around the distribution valley may be identified as on cells. For example, when the development time is advanced, memory cells having a threshold voltage similar to a read voltage provided on word lines may increase the read voltage to provide an effect of sensing the read voltage. On the other hand, when the development time is delayed, memory cells having a threshold voltage around the read voltage may lower the read voltage to provide an effect of sensing the read voltage. Therefore, sensing the sensing node SO a plurality of times at different development times may have the same effect as precharging and sensing the bit line BL by varying the word line voltage VWL.

A control signal LTCH_1 may be activated at a time advanced by $\Delta t$ on the basis of time T2 (e.g., T2−$\Delta t$). For example, the control signal LTCH_1 for latching a logic value corresponding to a state of the sensing node SO may be provided to a first latch LT_1 of each of the page buffers PB_1 to PBn in the same read voltage situations. At time T2, a control signal LTCH_2 for latching a state of the sensing node SO may be provided to a second latch LT_2 of each of the page buffers PB1 to PBn. A control signal LTCH_3 for latching a state of the sensing node SO may be provided to a third latch LT_3 of each of the page buffers PB1 to PBn, at the time delayed by $\Delta t$ on the basis of time T2 (e.g., T2+$\Delta t$).

Figure 8B:
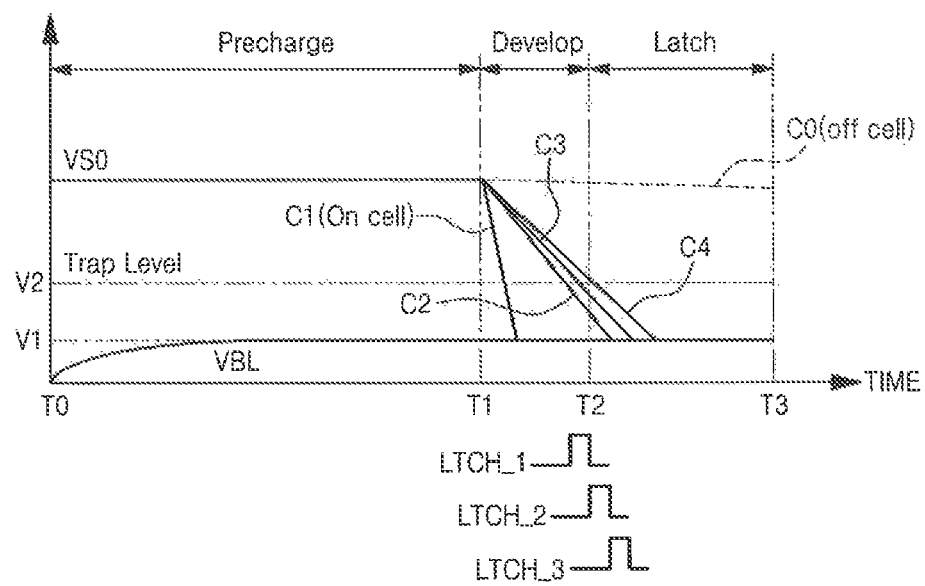
FIG. 8B is a waveform diagram illustrating a change in the level of a sensing node under conditions of control signals of FIG. 8A, according to an exemplary embodiment of the present inventive concept.

FIG. 8B is a waveform diagram illustrating a level change of a sensing node under a control signal situation of FIG. 8A, according to an exemplary embodiment of the present inventive concept. Referring to FIG. 8B, a level change of a sensing node SO according to a threshold voltage level of a memory cell, and a latch result according to a development time may be shown. Time T0 to time T1 may be referred to as a precharging period (Precharge), time T1 to time T2 may be referred to as a development period (Develop), and a period after a time T2 may be referred to as a latch period (Latch). On the other hand, a load signal LOAD may be inactivated in the development period, and a control signal BLSHF may be inactivated in the latch period, as illustrated in FIG. 7.

In the precharging period (Precharge), both the load signal LOAD and the control signal BLSHF may be activated to precharge a bit line BL and a sensing node SO. In the precharging period (Precharge), a bit line voltage VBL may be charged to a first voltage level V1. In the precharging period (Precharge), the sensing node SO may be charged with a sensing node voltage VSO.

At time T1 at which the development period (Develop) starts, the load signal LOAD may be inactivated. In this period, the control signal BLSHF may remain active. Accordingly, charges charged in the sensing node SO may be moved to the bit line BL according to a threshold voltage state of memory cell.

In a case of a memory cell (e.g., a Strong Off Cell) in which a threshold voltage is higher than a read voltage, a level change of the sensing node SO may be relatively small. Change in a sensing node (SO) electric potential of the strong off cell in the development period may be shown by the dashed line (C0). In a case of a memory cell (e.g., Strong On Cell) in which a threshold voltage is lower than a read voltage, a level change of the sensing node SO may be relatively large. Change in the sensing node (SO) electric potential of the strong on cell in the development period may be shown by a solid line (C1). In cases of strong off cells or strong on cells, a small change in the development time may be not significantly affected.

A change in electric potential of the sensing node SO sensing memory cells with threshold voltages located around a read voltage may be shown by solid lines C2, C3, and C4, respectively. The solid line C2 may show a development trend of a memory cell having a threshold voltage slightly lower than a read voltage. The solid line C3 may show a development trend of a memory cell having a threshold voltage almost similar to a read voltage. The solid line C4 may show a development trend of a memory cell with a threshold voltage slightly higher than a read voltage.

A first latching signal LTCH_1 for latching the sensing node SO of the memory cells may be provided by advancing a latching time by a reference time, on the basis of time T2. When the sensing nodes SO are latched by the first latching signal LTCH_1, in cases of a strong off cell and a strong on cell, the sensing nodes SO may be latched by logic values corresponding to off cells and on cells, respectively. The memory cells corresponding to the solid line C2 having a relatively low threshold voltage may be latched by logic values corresponding to the on cells, and the memory cells corresponding to the solid lines C3 and C4 may be latched by the logic values corresponding to the off cells.

When the sensing nodes SO are latched by the second latching signal LTCH_2, a logic '0' and a logic '1' may be latched in a case of a strong off cell (corresponding to C0) and in a case of a strong on cell (corresponding to C1), respectively, as in the case of the first latching signal LTCH_1. The memory cells having the threshold voltage corresponding to the solid line C2 may be latched by a logic value corresponding to an on cell. On the other hand, in the case of the memory cell corresponding to the solid line C3, the sensing node SO electric potential of a trap level V2 may be latched by the second latching signal LTCH_2. For example, the logic '0' and logic '1' may not be clear. Further, the memory cells corresponding to the solid line C4 may be latched by logic values corresponding to off cells.

When the sensing nodes SO are latched by the third latching signal LTCH_3, the logic '0' and the logic '0' may be latched in a case of a strong off cell C0 and in a case of a strong on cell C1, respectively, as in the first latching signal LTCH_1. The memory cells having the threshold voltages corresponding to the solid lines C2 and C3 may be latched by a logic value '1' corresponding to the on cell, and the memory cell corresponding to the solid line C4 may be latched by a logic value '0' corresponding to the off cell.

A method of latching a state of a sensing node SO at different development times from each other to identify any one state of memory cells has just been described. Depending on the development time, an effect similar to providing different levels of read voltages to word lines may be provided.

Figure 9:
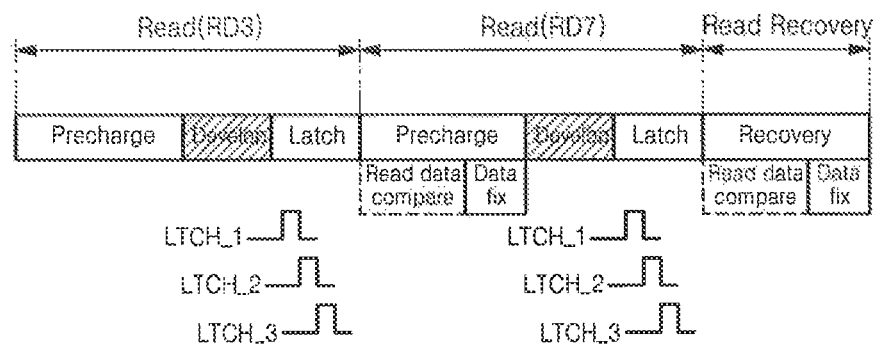
FIG. 9 is a timing diagram illustrating an example of applying an OCVS read operation according to the exemplary embodiments of FIGS. 8A and 8B to an uppermost bit page of a triple level cell TLC.

FIG. 9 is a timing diagram illustrating an example of applying an OCVS read operation according to the exemplary embodiments of FIGS. 8A and 8B to an uppermost bit page of a triple level cell TLC. Referring to FIG. 9, a read operation by a read voltage RD3 and a read operation by a read voltage RD7 may be performed to read a most significant bit (MSB) page of the triple level cell TLC by the OCVS method. Thereafter, read recovery Read Recovery in which voltages of a page buffer and a word line are initialized may be performed.

First, a bit line BL and a sensing node SO may be precharged for the OCVS read operation by the read voltage RD3. The read voltage RD3 may be provided to word lines of selected memory cells. When the precharging is completed, a development operation in which a change in electric potential of the sensing node SO is generated according to states of memory cells may be performed on the page buffers PB0 to PBn-1 (see FIG. 2). States of the memory cells selected by latching signals LTCH_1, LTCH_2, LTCH_3 provided at different development times may be sequentially latched. At this time, the latched data may be stored in a plurality of latches provided in each of the page buffers PB1 to PBn.

Then, a bit line BL and a sensing node SO may be precharged for an OCVS read operation by the read voltage RD7. The read voltage RD7 may be provided to word lines of selected memory cells. When the precharging is completed, a development operation in which a change in electric potential of the sensing node SO is generated according to states of memory cells may be performed on the page buffers PB1 to PBn. States of the memory cells selected by the latching signals LTCH_1, LTCH_2, LTCH_3 provided at different development times may be latched, and the latched data may be stored in a plurality of latches provided in each of the page buffers PB_1 to PBn.

Comparison and selection operations on data latched in the latches of each of the page buffers PB to PBn may be performed during a precharging period of a read operation by the read voltage RD7. For example, the number of memory cells may be counted by comparing data latched by the first latching signal LTCH_1 and data latched by the second latching signal LTCH_2. The number of memory cells may be counted by comparing data latched by the second latching signal LTCH_2 and data latched by the third latching signal LTCH_3. The number of the counted cells may be compared to select any one of data sets latched by each of the latching signals LTCH_1, LTCH_2, LTCH_3. This process is shown as a data fix (Data fix) in FIG. 9.

When the OCVS read operation by the read voltage RD7 is completed, the data comparison and selection operations may be performed in a pipelined manner together with the reading recovery. In the reading recovery period after the OCVS read operation, the bit lines BL and the sensing nodes SO may be restored to an initial voltage level. At this time, any one of the data sets latched by each of the latching signals LTCH_1, LTCH_2, LTCH_3 under the read voltage (RD7) condition may be selected through the comparison operation. Most significant bit (MSB) data may be determined by processing an OCVS read operation result by the read voltage RD3 and an OCVS reading result operation by the read voltage RD7.

Figure 10A:
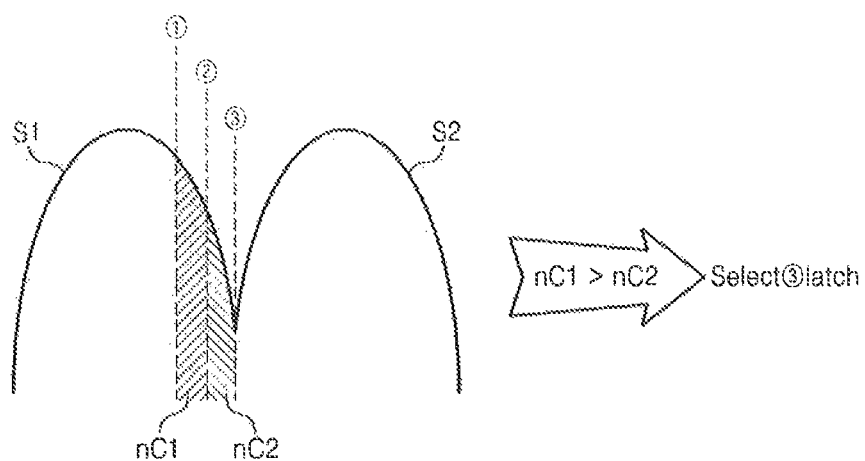
FIGS. 10A, 10B, and 10C are diagrams illustrating a method of selecting data using latch results of three sensing nodes according to three read signals, respectively, according to an exemplary embodiment of the present inventive concept.
Figure 10B:
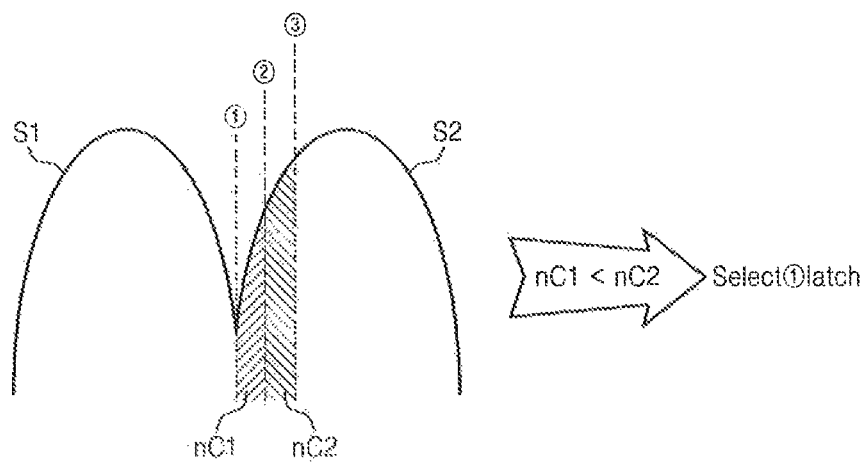
Figure 10C:
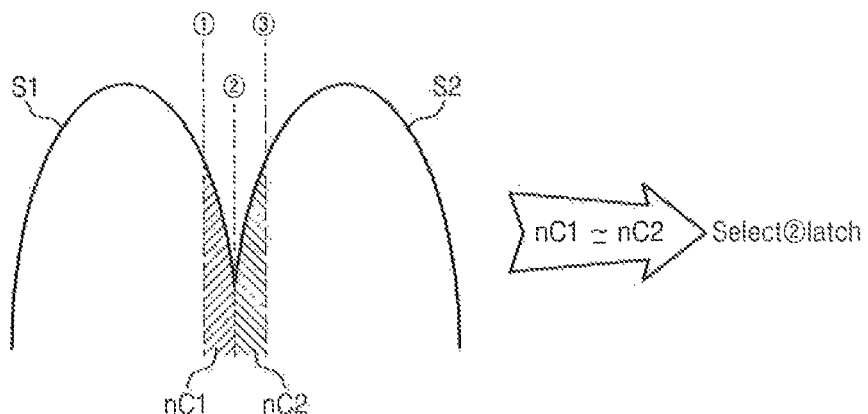

FIGS. 10A, 10B, and 10C are diagrams illustrating a method of selecting data using latch results of three sensing nodes SO according to three read signals, respectively, according to exemplary embodiments of the present inventive concept. FIG. 10A shows a data selection method in a case in which threshold voltages of memory cells sensed through an OCVS read operation are located on a left side of a distribution valley. FIG. 10B shows a data selection method in a case in which threshold voltages of memory cells sensed through an OCVS read operation are located on a right side of a distribution valley. FIG. 10C shows a data selection method in a case in which threshold voltages of sensed memory cells are located around a distribution valley.

Referring to FIGS. 10A, 10B, and 10C, a level of a threshold voltage of the memory cell stored in the latch sets may be modeled according to an OCVS read operation to identify two states S1 and S2 of the memory cell. The threshold voltage positions of the memory cells may be represented, as shown in the distribution diagram, when latched at different development times from each other or provided with different levels of read voltages. For example, a state of a sensing node SO to be latched by each of a first latching signal LTCH_1, a second latching signal LTCH_2, and a third latching signal LTCH_3 under the same read voltage condition may be matched to data sensed and stored by each of read voltages ①②③. Latch results corresponding to each of the read voltages ①②③ corresponding to the read signal will be referred to as a first latch set (e.g., 1st latch set), a second latch set (e.g., 2nd latch set), and a third latch set (e.g., 3rd latch set). For example, each of the first latch set ($1^{st}$ latch set), the second latch set ($2^{nd}$ latch set), and the third latch set ($3^{rd}$ latch set) may represent latches storing data latched by the first latching signal LTCH_1, the second latching signal LTCH_2, and the third latching signal LTCH_3, respectively.

Under this assumption, memory cells in which a threshold voltage is located between the read voltages ① and ② may be counted by comparing the first latch set and the second latch set. For example, when data latched in each of the first latch set and the second latch set is processed by an exclusive-OR (XOR) operation, the number nC1 of memory cells in which the threshold voltage is located between the read voltages ② and ③ may be counted. Similarly, the number nC2 of memory cells in which the threshold voltage is located between the read voltages ② and ③ may also be counted. This counting operation may be performed in the cell counter 170 shown in FIG. 1.

When the numbers nC1 and nC2 of memory cells are counted, the control logic 150 may compare a difference value |nC1−nC2| between the number nC1 of the first memory cells and the number nC2 of the second memory cells, with a first reference value A. On the other hand, when a difference value |nC1−nC2| is higher than the first reference value A, the counted number nC1 of the first memory cells may be compared with the counted number nC2 of the second memory cells. Data stored in one of the first latch set (1st latch set) and the third latch set (3rd latch set) may be selected, according to the result of comparison between the number nC1 of the first memory cells and the number nC2 of the second memory cells. On the other hand, when the counted number nC1 of the first memory cells and the counted number nC2 of the second memory cells are higher than a second reference value B, it may be determined as a reading failure, and a reading recovery (Reading Recovery) may be performed. In other words, in the event of a read fail, a read recovery operation may be performed. Further, when a difference value (nC1−nC2) is lower than the first reference value A, data stored in the second latch set (2nd latch set) may be selected. In this case, one of the counted number nC1 of the first memory cells and the number nC2 of the second memory cells may be output without being compared with the second reference value B. For example, when a difference value |nC1−nC2| is lower than the first reference value A, one of the counted number nC1 of the first memory cells and the number nC2 of the second memory cells may be output without being compared with the second reference value B. In this case, the first reference value A may define an error exclusion range.

Referring to FIG. 10A, when the difference value (nC1−nC2) is higher than the first reference value A, is lower than the second reference value B, and the number nC1 of cells is higher than the number of cells nC2 (nC1>nC2), the control logic 150 may select a latch set corresponding to the read voltage ③ level. For example, the reading result corresponding to the distribution valley may be determined as the data stored in the third latch set (3rd latch set). Referring to FIG. 10B, when the difference value (nC1−nC2) is higher than the first reference value A, is lower than the second reference value B, and the counted number nC2 of cells is higher than the number of cells nC1 (nC1<nC2), the control logic 150 may select a latch set corresponding to the read voltage ① level. For example, the reading result corresponding to the distribution valley may be determined as the data stored in the first latch set (1st latch set).

Referring to FIG. 10C, when the difference value (nC1−nC2) is lower than the first reference value A, for example, when the counted number of cells nC1 and the counted number of cells nC2 are the same (nC1=nC2) or similar to each other, or when the difference therebetween is lower than a reference value, the control logic 150 may select a latch set corresponding to the read voltage ② level. For example, the reading result corresponding to the distribution valley may be determined as the data stored in the second latch set (2nd latch set).

FIGS. 11A, 11B, 11C, and 11D are diagrams each illustrating methods of selecting data using latch results of two sensing nodes SO according to two read signals, respectively, according to an exemplary embodiment of the present inventive concept. Since FIGS. 11A to 11D are similar to FIGS. 10A to 10C, overlapping descriptions may be omitted, and differences may be mainly described.

When the number nC0 of memory cells is counted, the control logic 150 may compare the number nC0 of memory cells to a first reference value A and a second reference value B. The first reference value A may be lower than the second reference value B. When the number nC0 of memory cells is higher than the second reference value B, it may be determined as a reading failure, and reading recovery (Reading Recovery) may be performed. In other words, in the event of a read fail, a read recovery operation may be performed. On the other hand, since the first reference value A is lower than the second reference value B, the first reference value A may define the error exclusion range.

On the other hand, when the number nC0 of the memory cells is higher than the first reference value A and lower than the second reference value B, the number nC1 of the first memory cells and the number nC2 of the second memory cells may be compared. Data stored in one of the first latch set (1st latch set) and the third latch set (3rd latch set) may be selected, according to the result of comparison between the number nC1 of the first memory cells and the number nC2 of the second memory cells. In addition, when the number nC0 of memory cells is lower than the first reference value A, data stored in any one of the first latch set (1st latch set) and the second latch set (2nd latch set) may be selected.

Figure 11A:
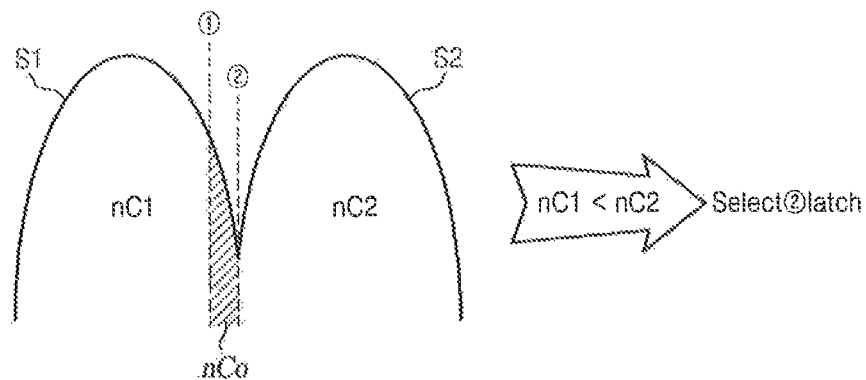
FIGS. 11A, 11B, 11C, and 11D are diagrams illustrating a method of selecting data using latch results of two sensing nodes according to two read signals, respectively, according to an exemplary embodiment of the present inventive concept.

Referring to FIG. 11A, when the number nC0 of memory cells is higher than the first reference value A and lower than the second reference value B (e.g., nC1<nC2), the control logic 150 may select a latch set corresponding to the read voltage ② level. For example, the reading result corresponding to the distribution valley may be determined as the data stored in the second latch set (2nd latch set).

Figure 11B:
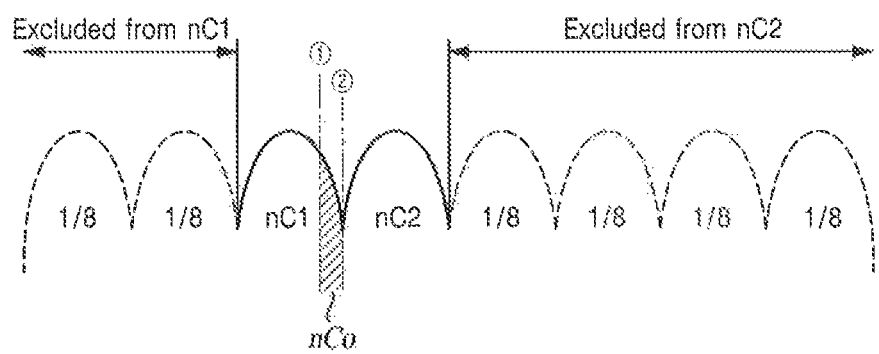

FIG. 11B shows a method of counting memory cells lower than or higher than a certain level in each of the above-described states S1 and S2. FIG. 11B shows a method of counting the number of memory cells included in a specific state to be subjected to an OCVS read operation in a multiple level cell (MLC) or a triple level cell TLC.

Referring to FIG. 11B, the number nC1 of memory cells may be calculated by subtracting the number (⅔) of memory cells allocated to two states from the reading result (e.g., number of on cells) by the read voltage C level. In addition, the number nC2 of memory cells may be calculated by subtracting the number (⅘) of memory cells allocated to the four states from the reading result (e.g., number of off cells) by the read voltage ② level.

Figure 11C:
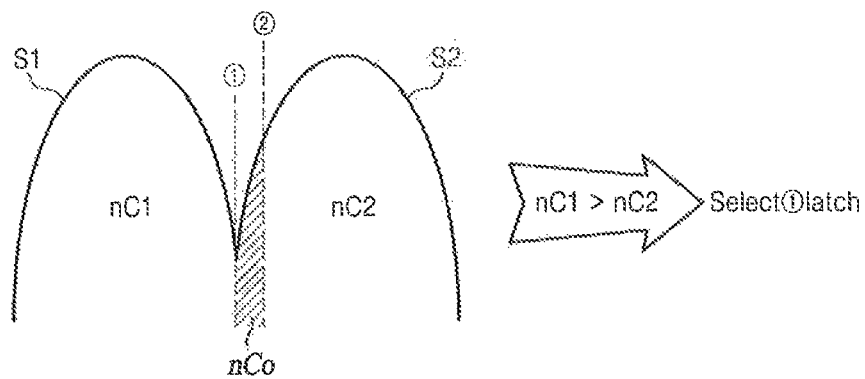

Referring to FIG. 11C, when the number nC0 of memory cells is higher than the first reference value A, lower than the second reference value B, and the counted number nC1 of cells is higher than the number nC2 of cells (nC>nC2), the control logic 150 may select a latch set corresponding to the read voltage ① level. For example, the reading result corresponding to the distribution valley may be determined as the data stored in the first latch set (1st latch set).

Figure 11D:
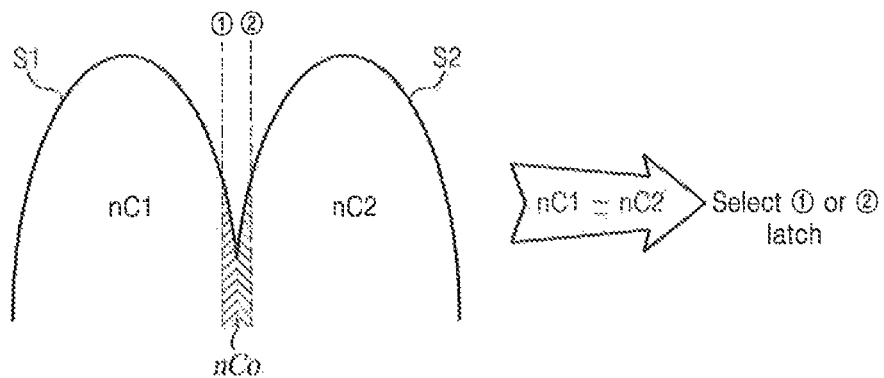

Referring to FIG. 11D, when the number nC0 of memory cells is lower than the first reference value A, for example, when the number nC of cells and the number nC2 of cells are identical to (nC1=nC2) or similar to each other, the control logic 150 may arbitrarily select and output the first latch set (1$^{st}$ latch set) or the second latch set (2$^{nd}$ latch set).

In the above-described embodiment, two or three read signals may be provided, but according to another exemplary embodiment of the present inventive concept, more than four read signals may be provided to read one piece of page data.

In addition, when an OCVS read operation for providing a plurality of read signals to identify one piece of page data of selected memory cells is applied to identify a plurality of page data, a reading time may be increased.

This may happen when an OCVS read operation is applied to a quad level cell QLC or the like that stores more data than a triple level cell TLC or the like, since a lot of time is used to latch a plurality of data. Therefore, a precharging period for comparing and selecting the latch period and the latched data is increased.

Figure 12:
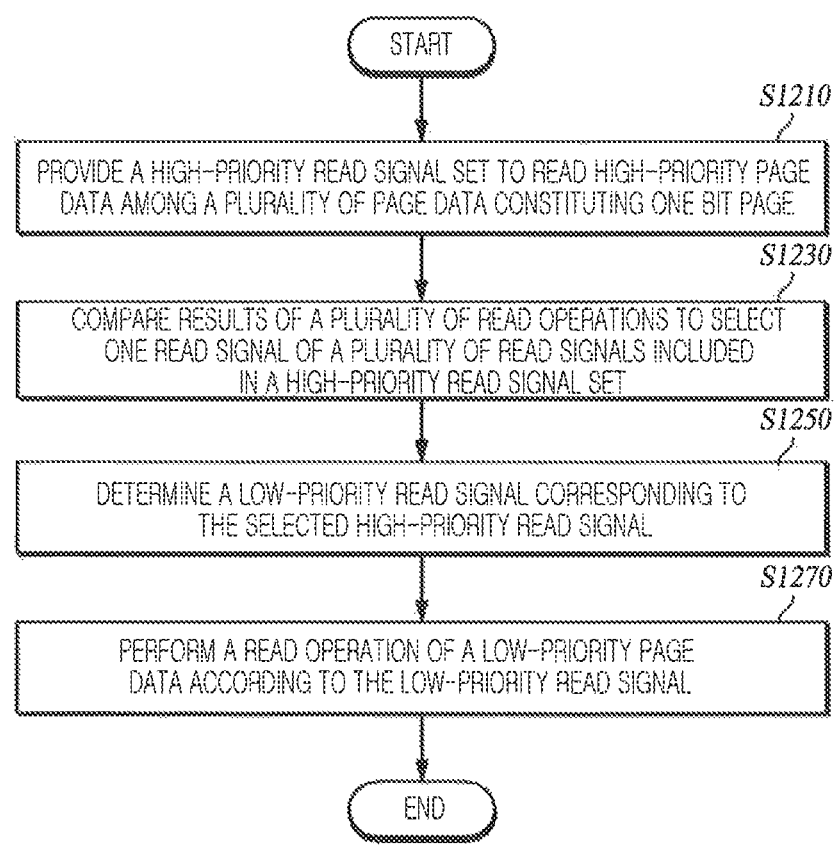
FIG. 12 is a flowchart of a read method of a non-volatile memory device according to an exemplary embodiment of the present inventive concept.

FIG. 12 is a flowchart of a read method of a non-volatile memory device according to an exemplary embodiment of the present inventive concept.

In operation S1210, the control logic 150 may provide a high-priority read signal set for reading high-priority page data of a plurality of page data constituting one bit page. The high-priority page data may be page data in which a high-priority read signal set including a plurality of high-priority read signals is provided to search an optimal distribution valley. The high-priority page data may be in plural, depending on an exemplary embodiment of the present inventive concept, to provide a different high-priority read signal set for each of the high-priority page data. For example, the high-priority page data(s) may correspond to page data for identifying each of the highest program states and the lowest program states among a plurality of page data constituting one bit page. Since a high-priority read signal set is provided, read operation results corresponding to the high-priority page data may be latched into a plurality of sets of latches. In operation S1230, the control logic 150 may compare the results of the plurality of read operations to select one read signal corresponding to the optimal distribution valley among the plurality of read signals included in the high-priority read signal set. In operation S1250, the control logic 150 may determine a low-priority read signal corresponding to the selected high-priority read signal. Subsequently, in operation S1270, the control logic 150 may perform a read operation of the low-priority page data according to the low-priority read signal.

Figure 13:
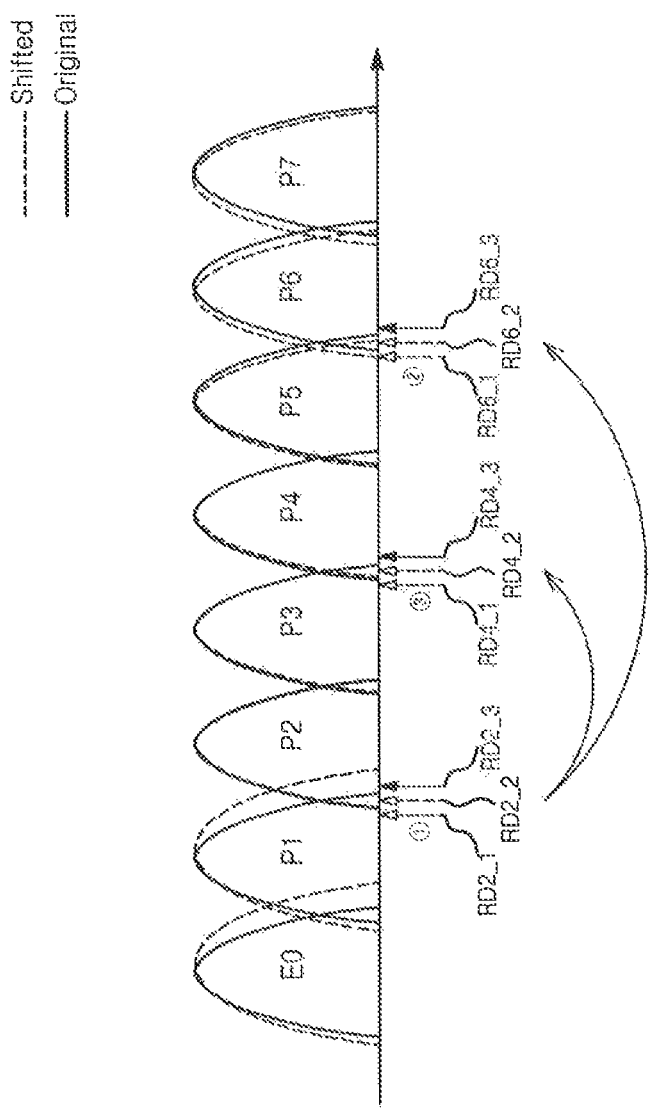
FIG. 13 is a diagram illustrating a read operation of FIG. 12, according to an exemplary embodiment of the present inventive concept.

FIG. 13 is a diagram for explaining a read operation of FIG. 12, according to an exemplary embodiment of the present inventive concept. In this embodiment, a read signal set comprising three read signals may be provided to read a center bit (CSB) page of the triple level cell TLC.

The control logic 150 may provide at least one high-priority read signal set to selected memory cells of the plurality of memory cells, and may provide one of the read signals included in each of the at least one low-priority read signal set, as a low-priority read signal.

In this embodiment, a first read signal set comprising a plurality of read voltages RD2_1, RD2_2 and RD2_3 may be a high-priority read signal set, a second read signal set comprising a plurality of read voltages RD6_1, RD6_2 and RD6_3 may be a low-priority read signal set (e.g., a second low-priority read signal set), and a third read signal set comprising a plurality of read voltages RD4_1, RD4_2 and RD4_3 may be a low-priority read signal set (e.g., a third low-priority read signal set). Depending on an exemplary embodiment of the present inventive concept, the high-priority/low-priority read signal set may be changed.

When the first read signal set including the plurality of read voltages RD2_1, RD2_2 and RD2_3 is provided, the read operation results of the page data for distinguishing the program states P1 and P2 among the page data may be latched to a plurality of latch sets. The number of memory cells between the plurality of read voltages RD2_1, RD2_2, RD2_3 of the first read signal set may be counted from the results of the read operation.

The control logic 150 may compare the count values of the memory cells between the current read voltages RD2_1, RD2_2, and RD2_3 to select the read signal corresponding to the optimal distribution valley. In this embodiment, a read signal corresponding to the read voltage RD2_3 shown by a solid line arrow among the read voltages RD2_1, RD2_2 and RD2_3 may be selected.

The control logic 150 may determine a low-priority read signal corresponding to the selected read signal in the high-priority read signal set. The control logic 150 may determine that the read voltage RD6_3 indicated by the solid line arrow corresponding to the level of the read voltage RD2_3 among the read voltages RD6_1, RD6_2, and RD6_3 of the second low-priority read signal set, is a low-priority read signal. Similarly, the control logic 150 may determine that the read voltage RD4_3 indicated by the solid line arrow corresponding to the level of the read voltage RD2_3 among the read voltages RD4_1, RD4_2 and RD4_3 of the third low-priority read signal set, is a low-priority read signal.

The control logic 150 may perform the read operation of the low-priority page data according to the read voltage RD4_3 and the read voltage RD6_3 determined by the low-priority read signal. In this case, the read operation according to the read voltage RD4_3 and the read voltage RD6_3 determined by the low-priority read signal may correspond to the normal read operation in which one read signal is provided to identify one operation.

When a latch set corresponding to a read operation according to the read voltage RD2_3, a latch set corresponding to a read operation according to the read voltage RD6_3, and a latch set corresponding to a read operation according to the read voltage RD4_3 are combined, a last read data of the center bit (CSB) page may be output.

In the above description, a low-priority read signal set is provided in advance, and one of the plurality of read signals in the low-priority read signal set is described as a low-priority read signal. However, a low-priority read signal corresponding to the read signal may be also generated, rather than having to provide it in advance.

Figure 14:
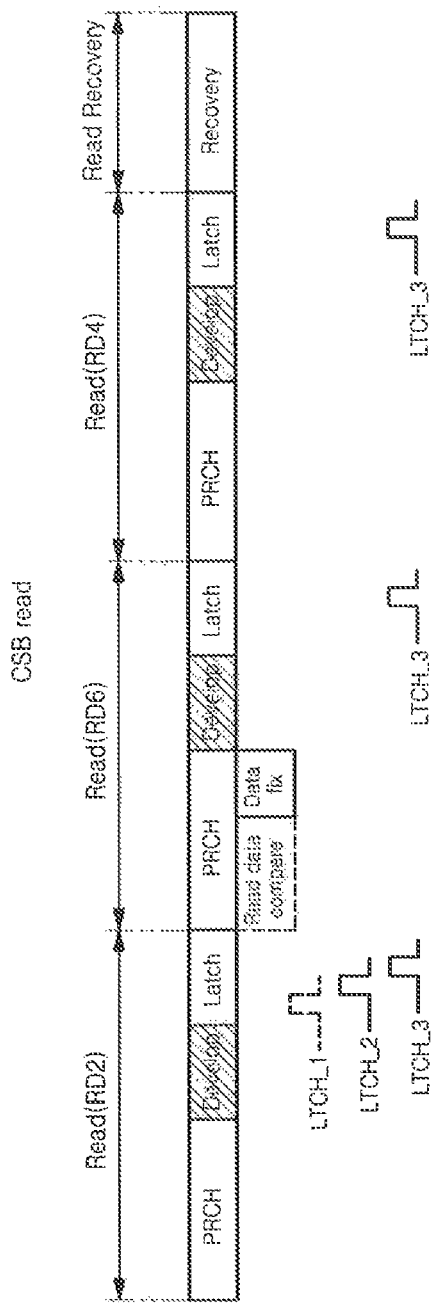
FIG. 14 is a timing diagram illustrating the application of a read operation of FIG. 13 to an center bit page of a triple level cell TLC, according to an exemplary embodiment of the present inventive concept.
Figure 15:
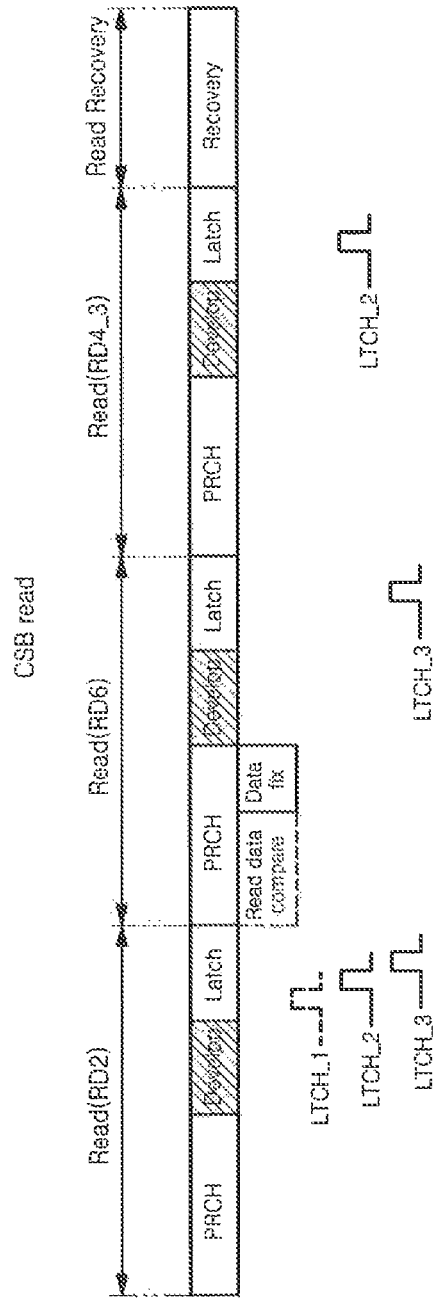
FIG. 15 is a timing diagram illustrating the application of a read operation of FIG. 13 to a center bit page of a triple level cell TLC, according to an exemplary embodiment of the present inventive concept.

FIG. 14 is a timing diagram illustrating the application of a read operation of FIG. 13 to a center bit page of a triple level cell TLC, according to an exemplary embodiment of the present inventive concept. FIG. 15 is a timing diagram illustrating the application of a read operation of FIG. 13 to a center bit page of a triple level cell TLC, according to an exemplary embodiment of the present inventive concept.

Referring to FIG. 14, an OCVS read operation according to a read voltage RD2, and a normal read operation by a read voltage RD6 and a read voltage RD4 may be performed to read a center bit (CSB) page of a triple level cell TLC. Thereafter, a read recovery operation (Read Recovery) in which voltages of a page buffer 130 and word lines WL are initialized may be performed.

First, bit lines BL of the memory cells selected in a precharging period PRCH and a sensing node SO may be precharged to perform an OCVS read operation according to the read voltage RD2. Latching signals LTCH_1, LTCH_2, and LTCH_3 may be sequentially provided at a plurality of times at which the sensing node SO is developed. In other words, the latching signals LTCH_1, LTCH_2, and LTCH_3 may be provided in a Develop period. In this case, the latching signal LTCH_2 may correspond to a default value, and the latching signals LTCH_1 and LTCH_3 may correspond to signals in which the latching time of the latching signal LTCH_2 has been partially changed to retrieve the optimal distribution valley. Data may be stored in different latch sets by each of the latching signals LTCH_1, LTCH_2, and LTCH_3. At this time, the latched data may be stored in a plurality of latches provided in each of the page buffers PB_1 to PBn.

Then, the bit line BL and the sensing node SO may be precharged for the normal read operation by a read voltage RD6. The word line WL of selected memory cells may be provided with the read voltage RD6. When the precharging is completed, a development operation may be performed in the page buffers PB1 to PBn in which a change in electric potential of the sensing node SO is generated according to states of memory cells.

In the precharging period of the read operation by the read voltage RD6, comparison and selection operations may be performed on the data latched in the latches of the page buffers PB1 to PBn by the read voltage RD2. For example, the number of memory cells may be counted by comparing data latched by the first latching signal LTCH_1 and data latched by the second latching signal LTCH_2. The number of memory cells may be counted by comparing the data latched by the second latching signal LTCH_2 with the data latched by the third latching signal LTCH_3. The number of counted cells may be compared to select any one of the data sets latched by each of the latching signals LTCH_1, LTCH_2, and LTCH_3. This process may be shown as a data fix (Data Fix) in the FIG. 14. In this case, under the condition of the read voltage RD2, the data set by the latching signal LTCH_3 may be finally selected.

A latching signal corresponding to the finally selected latching signal LTCH_3 under the condition of the read voltage RD2 may be provided under the condition of the read voltage RD6. For example, when the bit line BL and the development of the sensing node SO are performed under the read voltage RD6 condition, the latching signal LTCH_3 is provided such that the data may be latched. On the other hand, as described above, the level of the read signal may be varied by changing the level of the read voltage provided to the word line WL, or by changing the latching point of the sensing node SO. Referring to FIG. 15, in the data fix (Data Fix) period, a precharging period may be overlapped, and thus, a separate precharging period may be additionally required to change the level of the read voltage. Thus, in this embodiment, the latching time of the latching circuit may be changed. For example, it may be useful to change the level of the read signal by changing the latching point, rather than changing the level of the read signal by changing the read voltage in the first low-priority read operation after the high-priority read operation in which the high-priority read signal set is provided. In addition, in a situation where one voltage generating circuit is provided in the voltage generator 160 (FIG. 1) and different voltages are not provided to each of the plurality of memory blocks BLK0 to BLKi (FIG. 1), when the levels of the signals are different, the level of the read signal by varying the latching time of the sensing node SO may be appropriately varied.

Then, still referring to FIG. 14, the bit line BL and the sensing node SO may be precharged for the normal read operation by the read voltage RD4. The word line WL of selected memory cells may be provided with the read voltage RD4. When the precharging is completed, a development operation may be performed in the page buffers PB1 to PBn in which a change in electric potential of the sensing node SO is generated according to the state of the memory cell. When the development operation is performed, the latching signal LTCH_3 corresponding to the finally selected latching signal LTCH_3 under the condition of the read voltage RD2 may be provided under the condition of the read voltage RD4 such that the data are latched. The center bit (CSB) data may be determined by processing the OCVS read operation result by the read voltage RD2, the normal read operation result by the read voltage RD6, and the normal read operation result by the read voltage RD4.

In FIG. 14, data may be precharged by the read voltage RD4 and data may be latched by the latching signal LTCH_3. However, in FIG. 15, data is precharged by a read voltage RD4_3, and data may be latched by the signal LTCH_2. In this case, the read voltage RD4.3 may correspond to a voltage obtained by partially changing the voltage level according to the difference between the default read voltage RD4 and the latching time LTCH_1 of the default latching signal LTCH_2. For example, the read voltage RD4_3 corresponding to the selected latching signal LTCH_1 may be provided to read the second low-priority page data, instead of the latching signal LTCH_1 selected in the read voltage RD4.

According to an exemplary embodiment of the present inventive concept, the level of the read signal may be changed by changing the level of the read voltage, rather than by changing the latching time in the second low-priority read operation after the high-priority read operation in which the high-priority read signal set is provided. This may significantly reduce the change in the threshold voltage of the memory cells, thereby achieving a high resolution, and therefore may accurately determine the distribution valley.

Figure 16:
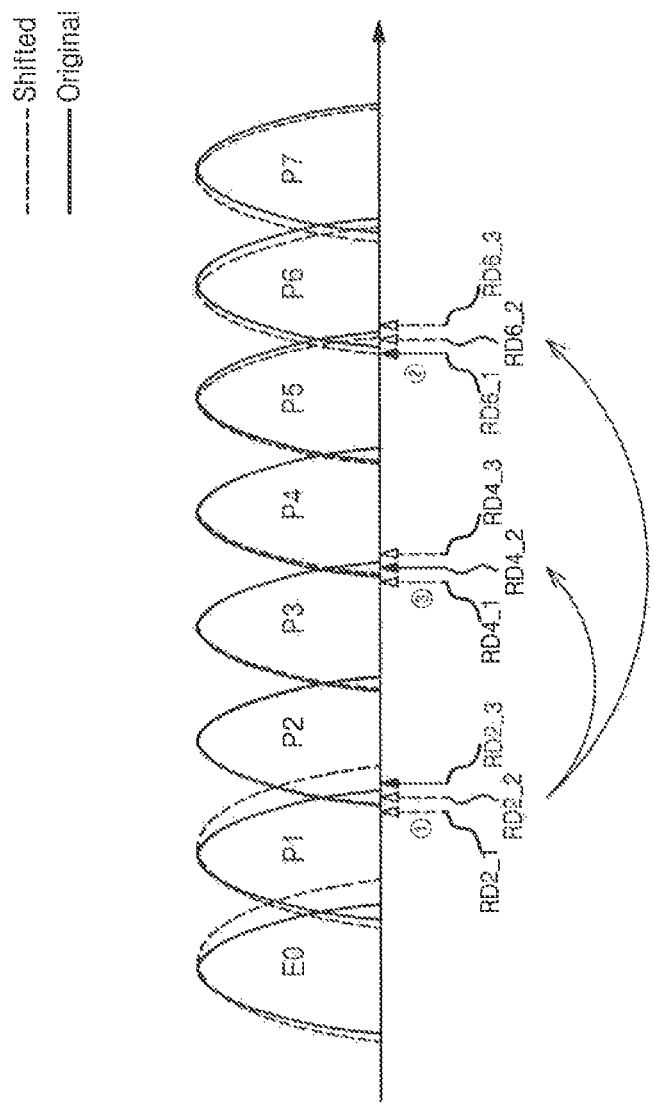
FIG. 16 is a diagram illustrating a read operation of FIG. 12, according to an exemplary embodiment of the present inventive concept.

FIG. 16 is a diagram illustrating a read operation of FIG. 12, according to an exemplary embodiment of the present inventive concept. Since the embodiment of FIG. 16 is similar to the embodiment of FIG. 13, overlapping descriptions may be omitted, and differences may be mainly described.

In general, variations in the threshold voltage distribution of memory cells may be varied, depending on the programmed state. In a case of an erase state E0 and a low-priority program state P1, distribution may be relatively spread to the right. Further, in a case of higher program states P6 and P7, distribution may be spread to the left. Although intermediate program states, e.g., P2, P3, P4, and P5, are somewhat different, the spread or shift of the distribution may appear to be negligible.

According to an exemplary embodiment of the present inventive concept, depending on the relationship between the program state of the high-priority page data, for example, the program state in which the high-priority read signal set is provided, and the program state of the low-priority page data, for example, the program state in which the low-priority read signal set is provided, the level of the low-priority read signal may be determined. For example, the level of the low-priority read signal may be determined by comparing the spread direction of distribution of the high-priority page data and the spread direction of distribution of the low-priority page data.

When the spread direction of distribution of the high-priority page data is opposite to the spread direction of distribution of the low-priority page data, the level of the selected high-priority read signal may be shifted in the direction opposite the spread direction of distribution of the high-priority page data. This way, the level of the low-priority read signal is determined. For example, if it is assumed that a high-priority read signal set is provided in a low-priority program state, the level of the selected high-priority read signal may be sequentially shifted in one direction, to determine the level of the read signal in the intermediate program state and the higher program state. In this case, one direction may be a direction opposite the spread direction of distribution in the lower program state, for example, the left direction. Likewise, if it is assumed that a high-priority read signal set is provided to the higher program state, the level of the selected high-priority read signal may be sequentially shifted in one direction to determine the level of the read signal in the intermediate program state and the low-priority program state. In this case, one direction may be a direction opposite the spread direction of distribution in the higher program, for example, the right direction.

The level of the low-priority read signal may be determined by comparing the spread of the high-priority page data to the spread of the scattered low-priority page data, when the spread direction of distribution of the high-priority page data is identical to the spread direction of distribution of the low-priority page data. For example, when the spread degree of distribution of the high-priority page data is higher than the spread degree of distribution of the low-priority page data, the level of the selected high-priority read signal may be shifted in the direction opposite the spread direction of distribution of the high-priority page data, to determine the low-priority read signal. Likewise, when the spread degree of distribution of the high-priority page data is lower than the spread degree of distribution of the low-priority page data, the level of the selected high-priority read signal may be shifted in the spread direction of distribution of the high-priority page data to determine the level of the low-priority read signal.

According to an exemplary embodiment of the present inventive concept, the high-priority read signal set may be provided in a program state having the highest spread degree to calculate an optimal low-priority read signal corresponding to the distribution valley.

In FIG. 16, when a read signal corresponding to the read voltage RD2_3 is selected among the first read signal set including the plurality of read voltages RD2_1, RD2_2 and RD2_3, the level of the selected first read voltage RD2_3 may be shifted. Then, the read voltage RD6_2 may be determined to be a low-priority read voltage in an intermediate program state, and the read voltage RD4_1 may be determined to be a low-priority read voltage in an higher program state.

Figure 17:
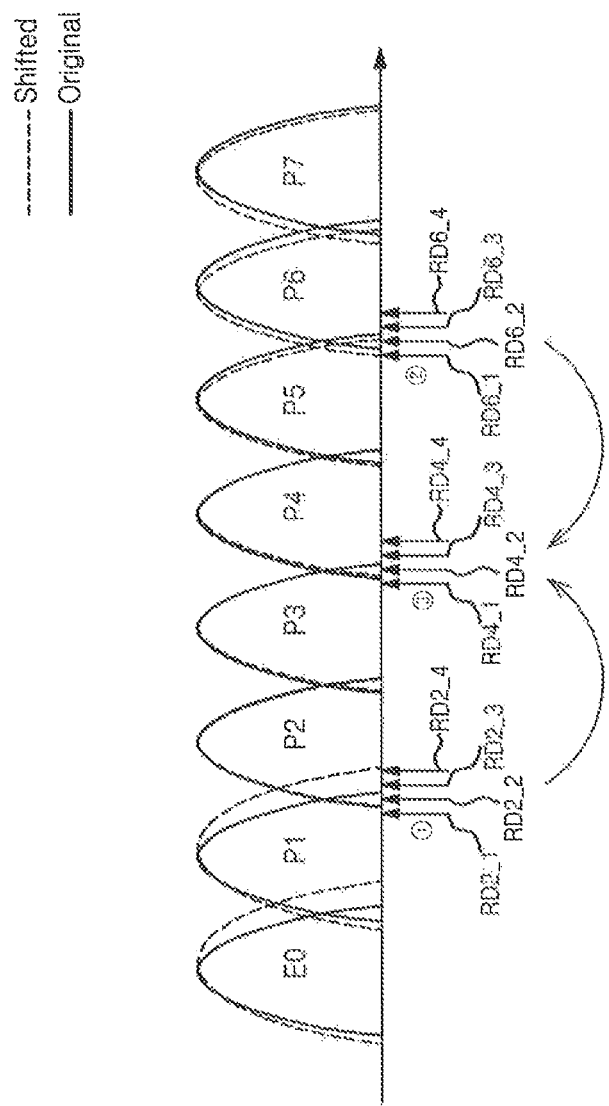
FIG. 17 is a diagram illustrating a read operation of FIG. 12, according to an exemplary embodiment of the present inventive concept.

FIG. 17 is a diagram illustrating a read operation of FIG. 12, according to an exemplary embodiment of the present inventive concept. Since the embodiment of FIG. 17 is similar to the embodiment of FIG. 13, overlapping descriptions may be omitted, and differences may be mainly described. In this embodiment, a read signal set composed of four read signals may be provided to read the center bit (CSB) page of the triple level cell TLC.

The control logic 150 may provide at least one high-priority read signal set to selected memory cells of the plurality of memory cells, and may provide one of the read signals included in each of the at least one low-priority read signal set as a low-priority read signal.

In this embodiment, a first read signal set including a plurality of read voltages RD2_1, RD2_2, RD2_3 and RD2_4 may be a first high-priority read signal set, a second read signal set including a plurality of read voltages RD6_1, RD6_2, RD6_3 and RD6_4 may be a second high-priority read signal set, and a third read signal set including a plurality of read voltages RD4_1, RD4_2, RD4_3, and RD4_4 may be low-priority read signals. According to an exemplary embodiment of the present inventive concept, the high-priority/low-priority read signal set may be changed.

When the first high-priority read signal set including the plurality of read voltages RD2_1, RD2_2, RD2_3 and RD2_4 is provided, the read operation results of the page data for distinguishing the program states P1 and P2 may be latched to a plurality of latch sets. The number of memory cells between the plurality of read voltages RD2_1, RD2_2, RD2_3, and RD2_4 of the first high-priority read signal set may be counted from the results of the read operation. The control logic 150 may compare the count values of the memory cells between the read voltages RD2_1, RD2_2, RD2_3, and RD2_4 to select the read signal corresponding to the optimal distribution valley.

When the second high-priority read signal set including the plurality of read voltages RD6_1, RD6_2, RD6_3 and RD6_4 is provided, the read operation results of the page data for distinguishing the program states P5 and P6 may be latched to a plurality of latch sets. The number of memory cells between the plurality of read voltages RD6_1, RD6_2, RD6_3, RD6_4 of the second high-priority read signal set may be counted from the results of the read operation. The control logic 150 may compare the count values of the memory cells between the read voltages RD6_1, RD6_2, RD6_3, and RD6_4 to select the read signal corresponding to the optimal distribution valley.

The control logic 150 may determine a low-priority read signal, depending on a read signal selected from the first high-priority read signal set and a read signal selected from the second high-priority read signal set.

Table 1 below is provided to illustrate a method for determining a low-priority read signal, depending on read signals selected from a first high-priority read signal set and a second high-priority read signal set.

TABLE 1

| | High-priority read signal | | Low-priority Read signal |
|---|---|---|---|
| | 1st RD(RD2) | 2nd RD(RD6) | 3rd RD(RD4) |
| Case 1 | RD2_1 | RD6_1 | RD4_1 |
| Case 2 | RD2_1 | RD6_2 | RD4_1 or RD4_2 |
| Case 3 | RD2_1 | RD6_3 | RD4_2 |
| Case 4 | RD2_1 | RD6_4 | RD4_2 or RD4_3 |
| Case 5 | RD2_2 | RD6_1 | RD4_1 or RD4_2 |
| Case 6 | RD2_2 | RD6_2 | RD4_2 |
| Case 7 | RD2_2 | RD6_3 | Case2 or RD4_3 |
| Case 8 | RD2_2 | RD6_4 | RD4_3 |
| Case 9 | RD2_3 | RD6_1 | RD4_2 |
| Case 10 | RD2_3 | RD6_2 | RD4_2 or RD4_3 |
| Case 11 | RD2_3 | RD6_3 | RD4_3 |
| Case 12 | RD2_3 | RD6_4 | RD4_3 or RD4_4 |
| Case 13 | RD2_4 | RD6_1 | RD4_2 or RD4_3 |
| Case 14 | RD2_4 | RD6_2 | RD4_3 |
| Case 15 | RD2_4 | RD6_3 | RD4_3 or RD4_4 |
| Case 16 | RD2_4 | RD6_4 | RD4_4 |

Referring to Table 1, in a case that the same level of read signals are selected from the first read signal set ($1^{st}$ RD) corresponding to the first high-priority read signal set and the second read signal set ($2^{nd}$ RD) corresponding to the second high-priority read signal set (e.g., Case 1, Case 6, Case 11, and Case 16), a read signal having the same level among a plurality of read signals of the third read signal set ($3^{rd}$ RD) may be determined as a low-priority read signal. For example, in a case that the read voltage RD2_1 is selected in the first high-priority read signal set and the read voltage RD6_1 is selected in the second high-priority read signal set (e.g., Case 1), the read signal corresponding to the read voltage RD4_1 in the third read signal set ($3^{rd}$ RD) may be determined as a low-priority read signal.

Further, in a case that read signals having different levels from each other are selected from the first read signal set ($1^{st}$ RD) corresponding to the first high-priority read signal set and the second read signal set ($2^{nd}$ RD) corresponding to the second high-priority read signal set (e.g., Case 2, Case 5, Case 7, Case 10, Case 12, and Case 15), the number of memory cells according to each of the selected read signals may be counted, to determine one read signal among the plurality of read signals of the third read signal set ($3^{rd}$ RD) as a low-priority read signal. For example, in a case that the read voltage RD2_1 is selected in the first high-priority read signal set, and the read voltage RD6_2 is selected in the second high-priority read signal set (e.g., Case 2), the number of memory cells in the program state P2 according to the read voltage RD2_1 may be compared to the number of memory cells in the program state P6 according to the read voltage RD6_2, to determine a read signal having a level corresponding to the read voltage having a small number of memory cells as low-priority read signals. As another example, when the read voltage RD2_1 is selected in the first high-priority read signal set, and the read voltage RD6_2 is selected in the second high-priority read signal set (e.g., Case 2), the number of memory cells in the program state P1 according to the read voltage RD2_1 may be compared to the number of memory cells in the program state P5 according to the read voltage RD6_2, such that a read signal having a level corresponding to the read voltage having a small number of memory cells may be determined as a low-priority read signal.

Further, when read signals having different levels from each other are selected from the first read signal set ($1^{st}$ RD) corresponding to the first high-priority read signal set and the second read signal set ($2^{nd}$ RD) corresponding to the second high-priority read signal set, and an odd number of read signals are present between the selected read signals having different levels from each other, the level of the read signal in the middle of the odd number of read signals among the plurality of read signals of the third read signal set ($3^{rd}$ RD) may be determined as a low-priority read signal. For example, when one read signal is present between the selected read signals having different levels from each other (e.g., Case 3, Case 8, Case 9, and Case 14), a read signal having a level corresponding to one read signal may be determined as a low-priority read signal.

Further, when read signals having different levels from each other are selected from the first read signal set ($1^{st}$ RD) corresponding to the first high-priority read signal set and the second read signal set ($2^{nd}$ RD) corresponding to the second high-priority read signal set, and an even number of read signals are present between the selected read signals having different levels from each other (e.g., Case 4, and Case 13), the number of memory cells according to each of the selected read signals is counted to determine one read signal among the plurality of read signals of the third read signal set ($3^{rd}$ RD) as a low-priority read signal. For example, when the read voltage RD2_1 is selected in the first high-priority read signal set, and the read voltage RD6_4 is selected in the second high-priority read signal set (e.g., Case 4), the number of memory cells in the program state P2 according to the read voltage RD2_1 and the number of memory cells in the program state P6 according to the read voltage RD6_4 may be compared to determine the level corresponding to the read voltage having a small number of memory cells as the level of the low-priority read signal.

Figure 18:
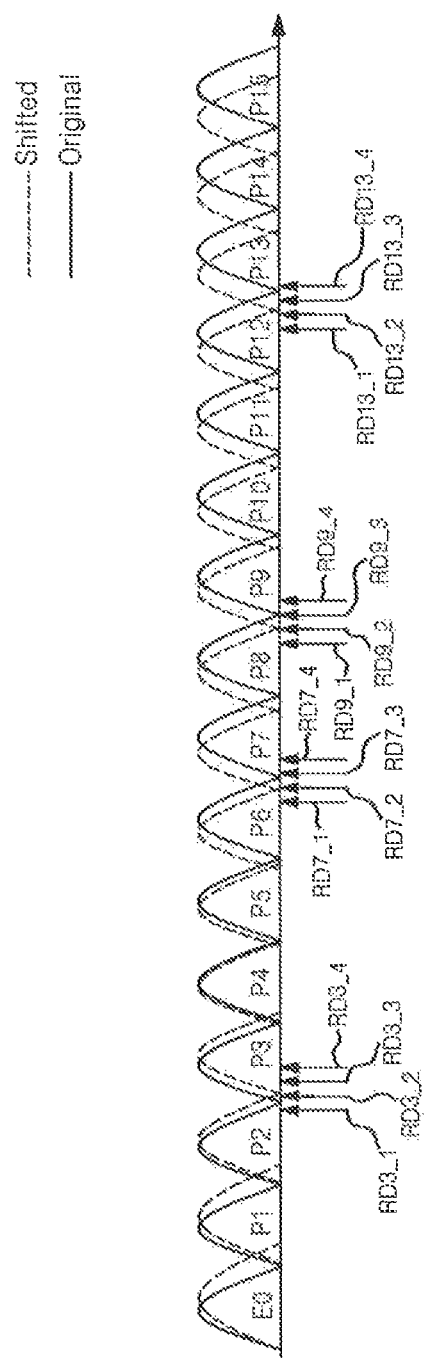
FIG. 18 is a diagram illustrating a read operation of FIG. 12, according to an exemplary embodiment of the present inventive concept.

FIG. 18 is a diagram illustrating a read operation of FIG. 12, according to an exemplary embodiment of the present inventive concept. Since the embodiment of FIG. 18 is similar to the embodiment of FIG. 17, overlapping descriptions may be omitted, and differences may be mainly described. In this embodiment, a read signal set comprising four read signals may be provided to read one bit page of a quad level cell QLC.

The control logic 150 may provide at least one high-priority read signal set to selected memory cells of a plurality of memory cells, and may provide one read signal included in each of the at least one low-priority read signal set as a low-priority read signal.

In this embodiment, a first read signal set including a plurality of read voltages RD13_1, RD13_2, RD13_3, and RD13_4 may be referred to as a first high-priority read signal set, a second read signal set including a plurality of read voltages RD3_1, RD3_2, RD3_3, and RD3_4 may be referred to as a second high-priority read signal set, a third read signal set including a plurality of read voltages RD7_1, RD7_2, RD7_3, and RD7_4 may be referred to as a first low-priority read signal set, and a fourth read signal set including the voltages RD9_1, RD9_2, RD9_3 and RD9_4 may be referred to as a second low-priority read signal set. According to an exemplary embodiment of the present inventive concept, the high-priority/low-priority read signal set may be changed.

When a first high-priority read signal set including the plurality of read voltages RD13_1, RD13_2, RD13_3 and RD13_4 is provided, read operation results of page data for distinguishing program states P2 and P3 among page data may be latched to a plurality of latch sets. The number of memory cells between the plurality of read voltages RD13_1, RD13_2, RD13_3, and RD13_4 of the first read signal set may be counted from the results of the read operation. The control logic 150 may compare the count values of the memory cells between the read voltages RD13_1, RD13_2, RD13_3, and RD13_4 to select the read signal corresponding to the optimal distribution valley.

When the second read signal set including a plurality of read voltages RD3_1, RD3_2, RD3_3 and RD3_4 is provided, read operation results of page data for distinguishing program states P12 and P13 among page data may be latched to a plurality of latch sets. The number of memory cells between the plurality of read voltages RD3_1, RD3_2, RD3_3, and RD3_4 of the second read signal set may be counted from the results of the read operation. The control logic may compare the count values of the memory cells between the read voltages RD3_1, RD3_2, RD3_3, and RD3_4 to select the read signal corresponding to the optimal distribution valley.

The control logic 150 may determine a low-priority read signal, depending on a read signal selected from the first high-priority read signal set and a read signal selected from the second high-priority read signal set.

Table 2 below is provided to illustrate a method for determining a low-priority read signal, depending on read signals selected from a first high-priority read signal set and a second high-priority read signal set.

TABLE 2

| | High-priority read signal | | Low-priority Read signal | |
| --- | --- | --- | --- | --- |
| | 1st RD(RD13) | 2nd RD(RD3) | 3rd RD(RD7) | 4th RD(RD 9) |
| Case 1 | RD13_1 | RD3_1 | RD7_1 | RD9_1 |
| Case 2 | RD13_1 | RD3_2 | RD7_2 | RD9_1 |
| Case 3 | RD13_1 | RD3_3 | RD7_2 | RD9_2 |
| Case 4 | RD13_1 | RD3_4 | RD7_3 | RD9_2 |
| Case 5 | RD13_2 | RD3_1 | RD7_1 | RD9_2 |
| Case 6 | RD13_2 | RD3_2 | RD7_2 | RD9_2 |
| Case 7 | RD13_2 | RD3_3 | RD7_3 | RD9_2 |
| Case 8 | RD13_2 | RD3_4 | RD7_3 | RD9_3 |
| Case 9 | RD13_3 | RD3_1 | RD7_2 | RD9_2 |
| Case 10 | RD13_3 | RD3_2 | RD7_2 | RD9_3 |
| Case 11 | RD13_3 | RD3_3 | RD7_3 | RD9_3 |
| Case 12 | RD13_3 | RD3_4 | RD7_4 | RD9_4 |
| Case 13 | RD13_4 | RD3_1 | RD7_2 | RD9_3 |
| Case 14 | RD13_4 | RD3_2 | RD7_3 | RD9_3 |
| Case 15 | RD13_4 | RD3_3 | RD7_3 | RD9_4 |
| Case 16 | RD13_4 | RD3_4 | RD7_4 | RD9_4 |

Referring to Table 2, in a case that the same level of read signals are selected from the first read signal set ($1^{st}$ RD) corresponding to the first high-priority read signal set and the second read signal set ($2^{nd}$ RD) corresponding to the second high-priority read signal set (e.g., Case 1, Case 6, Case 11, and Case 16), a read signal having the same level among each of a plurality of read signals of the third read signal set ($3^{rd}$ RD) and the fourth read signal set ($4^{th}$ RD) may be determined as a low-priority read signal. For example, in a case that the read voltage RD13_1 is selected in the first high-priority read signal set and the read voltage RD3_1 is selected in the second high-priority read signal set (e.g., Case 1), the read signal corresponding to the read voltage RD7_1 in the third read signal set ($3^{rd}$ RD) may be determined as a low-priority read signal, and the read signal corresponding to the read voltage RD9_1 in the fourth read signal set ($4^{th}$ RD) may be determined as a low-priority read signal.

Further, in a case that read signals having different levels from each other are selected from the first read signal set ($1^{st}$ RD) corresponding to the first high-priority read signal set and the second read signal set ($2^{nd}$ RD) corresponding to the second high-priority read signal set, and the selected read signals having different levels from each other are adjacent to each other (e.g., Case 2, Case 5, Case 7, Case 10, Case 12, and Case 15), the level of the read signal selected from the first high-priority read signal set may be applied to the low-priority read signal set disposed adjacent to the first high-priority read signal set, and the level of the read signal selected from the second high-priority read signal set may be applied to the low-priority read signal set disposed adjacent to the second high-priority read signal set. For example, in a case that the read voltage RD13_1 is selected in the first high-priority read signal set, and the read voltage RD3_2 is selected in the second high-priority read signal set (e.g., Case 2), the read signal corresponding to the read voltage RD7_2 in the third read signal set ($3^{rd}$ RD) may be determined as a low-priority read signal, and the read signal corresponding to the read voltage RD9_1 in the fourth read signal set ($4^{th}$ RD) may be determined as a low-priority read signal.

Further, when read signals having different levels from each other are selected from the first read signal set ($1^{st}$ RD) corresponding to the first high-priority read signal set and the second read signal set ($2^{nd}$ RD) corresponding to the second high-priority read signal set, and an odd number of read signals are present between the selected read signals having different levels from each other, the level of the read signal in the middle of the odd number of read signals may be determined as a low-priority read signal. For example, when one read signal is present between the selected read signals having different levels from each other (e.g., Case 3, Case 8, Case 9, and Case 14), a read signal having a level corresponding to one read signal may be determined as a low-priority read signal.

Further, when read signals having different levels from each other are selected from the first read signal set ($1^{st}$ RD) corresponding to the first high-priority read signal set and the second read signal set ($2^{nd}$ RD) corresponding to the second high-priority read signal set, and an even number of read signals are present between the selected read signals having different levels from each other (e.g., Case 4, and Case 13), a first level close to a level of a read signal selected from the first high-priority read signal set may be applied to the low-priority read signal set disposed adjacent to the first high-priority read signal set, and a first level close to a level of a read signal selected from the second high-priority read signal set may be applied to the low-priority read signal set disposed adjacent to the second high-priority read signal set.

Figure 19:
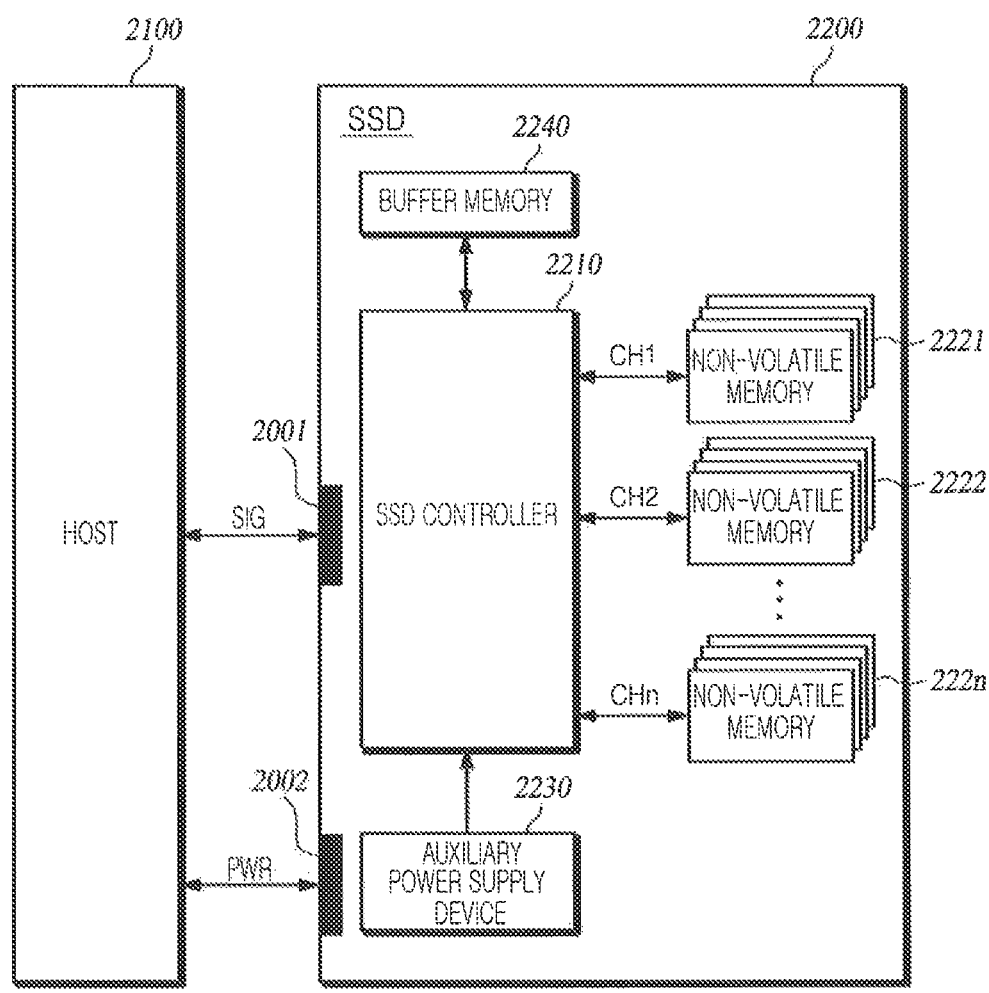
FIG. 19 is a block diagram illustrating a Solid State Drive (SSD) system to which a non-volatile memory system according to an exemplary embodiment of the present inventive concept is applied.

FIG. 19 is a block diagram illustrating a Solid State Drive (SSD) system to which a non-volatile memory system according to an exemplary embodiment of the present inventive concept is applied. Referring to FIG. 19, the SSD system 2000 may include a host 2100 and an SSD 2200. The SSD 2200 may exchange a signal SIG with the host 2100 through a signal connector 2001, and may receive a power PWR through a power supply connector 2002. The SSD 2200 may include an SSD controller 2210, a plurality of non-volatile memories 2221-222n, an auxiliary power supply device 2230, and a buffer memory 2240. The non-volatile memories 2221-222n may be flash memories.

The SSD controller 2210 may control the plurality of flash memories 2221-222n in response to the signal SIG received from the host 2100.

The auxiliary power supply device 2230 may be connected to the host 2100 through the power supply connector 2002. The auxiliary power supply device 2230 may receive and charge the power PWR from the host 2100. The auxiliary power supply device 2230 may provide power to the SSD system 2000, when power is not smoothly supplied from the host 2100. For example, the auxiliary power supply device 2230 may be disposed within the SSD 2200 or outside the SSD 2200. For example, the auxiliary power supply device 2230 may be disposed on the main board, and may provide an auxiliary power to the SSD 2200.

The buffer memory 2240 may be operated as a buffer memory of the SSD 2200. For example, the buffer memory 2240 may temporarily store data received from the host 2100 or data received from the plurality of flash memories 2221-222n, or may temporarily store metadata of the flash memories 2221 to 222n (for example, a mapping table). The buffer memory 2240 may include other non-volatile memories such as dynamic RAM (DRAM), synchronous DRAM (SDRAM), double data rate (DDR) SDRAM, low power DDR (LPDDR) SDRAM, static (SRAM), or the like, or non-volatile memories such as FRAM, ReRAM, spin transfer torque (STT)-MRAM, PRAM, or the like.

According to an exemplary embodiment of the present inventive concept, a plurality of sensing procedures may be performed to identify a specific page data state from one bit page, and one sensing procedure may be performed to identify states of remaining page data to effectively reduce time required to read in a read operation. For example, a non-volatile memory device may be configured to sense a plurality of times to identify a specific state of a memory cell, and to select and output optimal data among the sensed results.

While the present inventive concept has been described with reference to exemplary embodiments thereof, it will be apparent to those skilled in the art that modifications and variations could be made thereto without departing from the scope of the present inventive concept as defined by the appended claims.

What is claimed is:

1. A non-volatile memory device, comprising:
a page buffer configured to latch a plurality of page data constituting one bit page of a plurality of bit pages, and
a control logic configured to compare results of a plurality of read operations performed in response to a high-priority read signal set to select one of a plurality of read signals included in the high-priority read signal set as a high-priority read signal, and determine a low-priority read signal corresponding to the high-priority read signal, wherein the high-priority read signal set is for reading high-priority page data, and the low-priority read signal is for reading low-priority page data.

2. The non-volatile memory device according to claim 1, wherein a level of the low-priority read signal corresponds to a level of the high-priority read signal.

3. The non-volatile memory device according to claim 1, wherein a level of the low-priority read signal is different from a level of the high-priority read signal.

4. The non-volatile memory device according to claim 1, wherein the control logic is configured to determine a level of the low-priority read signal, depending on a program state of the high-priority page data and a program state of the low-priority page data.

5. The non-volatile memory device according to claim 1, wherein the control logic is configured to determine a level of the low-priority read signal by comparing a spread direction of distribution of the high-priority page data and a spread direction of distribution of the low-priority page data.

6. The non-volatile memory device according to claim 5, wherein, when the spread direction of distribution of the high-priority page data is opposite to the spread direction of distribution of the low-priority page data, the control logic is configured to shift a level of the high-priority read signal in a direction opposite to the spread direction of distribution of the high-priority page data to determine the level of the low-priority read signal.

7. The non-volatile memory device according to claim 6, wherein, when a program state of the low-priority page data is higher than a program state of the high-priority page data, the control logic is configured to shift the level of the high-priority read signal in a lower program direction to determine the level of the low-priority read signal.

8. The non-volatile memory device according to claim 6, wherein, when the program state of the low-priority page data is lower than the program state of the high-priority page data, the control logic is configured to shift the level of the high-priority read signal to a higher program direction to determine the level of the low-priority read signal.

9. The non-volatile memory device according to claim 5, wherein, when the spread direction of distribution of the high-priority page data is identical to the spread direction of distribution of the low-priority page data, the control logic is configured to compare a spread degree of distribution of the high-priority page data to a spread degree of distribution of the low-priority page data.

10. The non-volatile memory device according to claim 9, wherein, when the spread degree of distribution of the high-priority page data is higher than the spread degree of distribution of the low-priority page data, the control logic is configured to shift a level of the high-priority read signal in a direction opposite to the spread direction of distribution of the high-priority page data to determine the level of the low-priority read signal.

11. The non-volatile memory device according to claim 9, wherein, when the spread degree of distribution of the high-priority page data is lower than the spread degree of distribution of the low-priority page data, the control logic is configured to shift a level of the high-priority read signal in the spread direction of distribution of the high-priority page data to determine the level of the low-priority read signal.

12. The non-volatile memory device according to claim 1, wherein the control logic is configured to change a latching time of the page buffer to vary a level of the low-priority read signal, during a read operation of the low-priority page data following a read operation of the high-priority page data.

13. The non-volatile memory device according to claim 12, wherein the control logic is configured to change the latching time of the page buffer to vary the level of the low-priority read signal, during a read operation of a first low-priority page data among the low-priority page data.

14. The non-volatile memory device according to claim 13, wherein the control logic is configured to change a level of a read voltage provided to memory cells connected to the page buffer to vary the level of the low-priority read signal, during a read operation of page data following the read operation of the first low-priority page data.

15. A non-volatile memory device, comprising:
a page buffer including a latch set for latching a plurality of page data constituting one bit page of a plurality of bit pages; and
a control logic for comparing results of a plurality of read operations performed in response to a plurality of high-priority read signal sets to select a high-priority read signal in each of the high-priority read signal sets, and for determining a level of a low-priority read signal, depending on a level of the high-priority read signal selected in each of the high-priority read signal sets, during a read operation of low-priority page data following a read operation of high-priority page data, wherein the plurality of high-priority read signal sets are for reading the high-priority page data.

16. The non-volatile memory device according to claim 15, wherein the high-priority page data comprise a first high-priority page data, obtained by reading with a first high-priority read signal set among the high-priority read signal sets, and a second high-priority page data, obtained by reading with a second high-priority read signal set among the high-priority read signal sets, after the first high-priority page data is obtained.

17. The non-volatile memory device according to claim 16, wherein the first high-priority page data and the second high-priority page data correspond to page data for identifying each of a highest program state and a lowest program state among the plurality of page data constituting the one bit page.

18. The non-volatile memory device according to claim 16, wherein, when a level of a first high-priority read signal selected from the first high-priority read signal set is identical to a level of a second high-priority read signal selected from the second high-priority read signal set, the low-priority read signal has the same level as the first high-priority read signal and the second high-priority read signal.

19. The non-volatile memory device according to claim 16, wherein, when a level of a first high-priority read signal selected from the first high-priority read signal set is different from a level of a second high-priority read signal selected from the second high-priority read signal set, and the level of the first high-priority read signal is adjacent to the level of the second high-priority read signal, the low-priority read signal has the same level as the first high-priority read signal or the second high-priority read signal.

20. The non-volatile memory device according to claim 19, wherein the level of the low-priority read signal is determined, depending on a number of memory cells counted by the first high-priority read signal and the second high-priority read signal.

21. The non-volatile memory device according to claim 19, wherein the level of the low-priority read signal is determined, depending on a position of the first high-priority page data, the second high-priority page data, and the low-priority page data.

22. The non-volatile memory device according to claim 16, wherein, when a level of a first high-priority read signal selected from the first high-priority read signal set is different from a level of a second high-priority read signal selected from the second high-priority read signal set, and an odd number of levels are between the level of the first high-priority read signal and the level of the second high-priority read signal, the low-priority read signal has a level at an intermediate level of the odd number of levels.

23. The non-volatile memory device according to claim 16, wherein, when a level of a first high-priority read signal selected from the first high-priority read signal set is different from a level of a second high-priority read signal selected from the second high-priority read signal set, and an even number of levels are between the level of the first high-priority read signal and the level of the second high-priority read signal, the low-priority read signal has the same level as one of the even number of levels, depending on a position of the first high-priority page data, the second high-priority page data, and the low-priority page data.

24. A read method of a non-volatile memory device, comprising:
comparing results of a plurality of read operations performed according to a high-priority read signal set,
selecting a high-priority read signal corresponding to high-priority page data from the high-priority read signal set; and
determining low-priority read signals for reading low-priority page data, depending on the level of the high-priority read signal,
wherein levels of the low-priority read signals are determined by comparing a spread direction of distribution of the high-priority page data and a spread direction of distribution of the low-priority page data.

25. The read method of a non-volatile memory device according to claim 24, further comprising shifting sequentially the level of the high-priority read signal in a direction opposite to the spread direction of distribution of the high-priority page data to determine the levels of the low-priority read signals, when the spread direction of distribution of the high-priority page data is opposite to the spread direction of distribution of the low-priority page data.

26. The read method of a non-volatile memory device according to claim 24, further comprising comparing a spread degree of distribution of the high-priority page data to a spread degree of distribution of the low-priority page data to determine the levels of the low-priority read signals, when the spread direction of distribution of the high-priority page data is identical to the spread direction of distribution of the low-priority page data.

27. A non-volatile memory device, comprising:
a page buffer configured to latch a plurality of page data constituting one bit page of a plurality of bit pages, and
a control logic configured to perform an On-Chip Valley Search (OCVS) reading operation to identify high-priority page data, and a normal reading operation to identify low-priority page data, wherein a low-priority read signal is selected for the normal reading operation by using a high-priority read signal from the high-priority page data.

28. The non-volatile memory device of claim 27, wherein, in the OCVS reading operation, the control logic is configured to compare results of a plurality of read operations to select the high-priority read signal.

29. The non-volatile memory device of claim 28, wherein, in the normal reading operation, the low-priority page data is read according to the low-priority read signal.

* * * * *